US006240158B1

(12) United States Patent
Oshino

(10) Patent No.: US 6,240,158 B1
(45) Date of Patent: May 29, 2001

(54) X-RAY PROJECTION EXPOSURE APPARATUS WITH A POSITION DETECTION OPTICAL SYSTEM

(75) Inventor: Tetsuya Oshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/249,780

(22) Filed: Feb. 16, 1999

(30) Foreign Application Priority Data

Feb. 17, 1998 (JP) .................................................. 10-035108
Feb. 19, 1998 (JP) .................................................. 10-037616
Feb. 19, 1998 (JP) .................................................. 10-037617

(51) Int. Cl.[7] ..................................................... G21K 5/00
(52) U.S. Cl. .............................. 378/34; 378/205; 378/206
(58) Field of Search ............................... 378/34, 205, 206

(56) References Cited

U.S. PATENT DOCUMENTS

| 5,325,414 | * | 6/1994 | Tanaka et al. | 378/34 |
| 5,377,009 | * | 12/1994 | Kitaoka et al. | 356/401 |
| 5,396,335 | * | 3/1995 | Hasegawa et al. | 356/401 |
| 5,440,394 | * | 8/1995 | Nose et al. | 356/384 |
| 5,549,994 | * | 8/1996 | Watanabe et al. | 430/5 |
| 5,600,698 | * | 2/1997 | Terashima et al. | 378/34 |
| 5,641,593 | * | 6/1997 | Watanabe et al. | 430/5 |

OTHER PUBLICATIONS

Eugene Hecht and Alfred Zajac. Optics (Reading, MA: Addison–Wesley, 1979), p. 286–294.*
Jenkins, P. et al., High Throughput Excimer Laser Stepper [PAS5500/300], Electronic Materials, Mar., 1996, pp. 98–101.

* cited by examiner

Primary Examiner—David V. Bruce
Assistant Examiner—Allen C. Ho
(74) Attorney, Agent, or Firm—Morgan, Lewis & Bockius LLP

(57) ABSTRACT

An X-ray projection exposure apparatus has at least an X-ray source, an X-ray illumination optical system which directs X-rays generated by the X-ray source onto a mask having a prescribed pattern, an X-ray projection focusing optical system which receives X-rays from the mask and projects and focuses an image of the pattern on a substrate. The X-ray projection exposure apparatus further has a mask stage which holds the mask, a substrate stage which holds the substrate, and a position detection optical system which optically detects marks on the mask and substrate. In the X-ray projection exposure apparatus, the projection focusing optical system includes a plurality of reflective mirrors that reflect the X-rays, and at least a portion of the position detection optical system is disposed among the plurality of reflective mirrors.

29 Claims, 16 Drawing Sheets

X-RAY PROJECTION EXPOSURE APPARATUS WITH A POSITION DETECTION OPTICAL SYSTEM

This application claims the benefit of Japanese Applications No. 10-035108, filed in Japan on Feb. 17, 1998, No. 10-037616, filed in Japan on Feb. 19, 1998, and No. 10-037617, filed in Japan on Feb. 19, 1998, all of which are hereby incorporated by reference.

BACKGROUND OF THE INVENTION

1. Field of the Invention

The present invention relates to an X-ray projection exposure apparatus, and more particularly, to an X-ray projection exposure apparatus which is suitable for transferring a circuit pattern formed on a mask (also referred to as "reticle") onto a substrate, such as a wafer, via a reflective type focusing X-ray optical system using a mirror projection scheme or the like.

2. Discussion of the Related Art

Conventionally, in exposure apparatus used for semiconductor manufacture, circuit patterns formed on a mask (photo-mask) used as an object surface are projected and transferred onto the surface of a photosensitive substrate such as a wafer or substrate for forming a mask, etc., via a focusing optical system. The photosensitive substrate is coated with a resist. The resist is exposed with exposing light to form a rest pattern.

The resolving power W of the exposure apparatus is determined mainly by the wavelength $\lambda$ of the exposing light and the numerical aperture NA of the focusing optical system, and is expressed by the following equation:

$$W = k1\lambda/NA \text{ (k1:constant)} \tag{1}$$

Accordingly, in order to improve the resolving power, it is necessary to shorten the wavelength and/or increase the numerical aperture. Currently, exposure apparatus used in the manufacture of semiconductor devices uses mainly the i-line having a wavelength of 365 nm, and a resolving power of 0.5 $\mu$m is obtained at a numerical aperture of about 0.5. Since increasing the numerical aperture is difficult due to various constraints in optical design, it will be necessary in the future to shorten the wavelength of the exposing light. Excimer lasers are examples of exposing light that has a wavelength shorter than the i-line. The wavelengths are 248 nm for the KrF excimer laser and 193 for the ArF excimer laser, respectively. A resolving power of 0.25 $\mu$m is obtained in the case of the KrF excimer laser, and a resolving power of 0.18 $\mu$m is obtained in the case of ArF. Furthermore, if X-rays with an even shorter wavelength are used as exposing light, a resolving power of 0.1 $\mu$m or less should be possible at a wavelength of 13 nm, for example.

The main components of the conventional exposure apparatus are a light source, an illumination optical system, and a projection focusing optical system. The projection focusing optical system is constructed from a plurality of lenses or reflective mirrors, etc., so as to focus the mask pattern on the mask onto a substrate, such as a wafer.

To obtain a desired resolving power, it is necessary that at least the focusing optical system be essentially free from aberration. If aberration is present in the focusing optical system, the sectional profile of the resist pattern deteriorates, and as a result, adverse effects on the processes following the exposure and/or the problem of image distortion may arise.

In the conventional exposure apparatus for manufacturing semiconductor devices or the like, a position detection device (also referred to as "alignment device") is provided so that a resist pattern can be formed at a predetermined position on the wafer with respect to an existing circuit patterns on the wafer. The alignment device detects the positions of the mask and wafer, and the respective detected positions of the wafer and the mask are adjusted by a wafer stage and a mask stage so that a reduced image of the mask pattern is focused at a prescribed position on the wafer.

An example of the alignment device is an optical detection device. This type of device detects alignment marks on the wafer by illuminating the marks and detecting the light reflected from the alignment marks through a photo-detector, for example. When the wafer position changes, the signal output from the photo-detector also changes, thereby enabling the detection of the wafer position. Similarly, the position of the mask can be detected by illuminating the alignment marks on the mask with illuminating light, and then detecting the light reflected from the alignment marks through a photo-detector, for example.

Such an alignment device can detect the positions of the respective marks on the wafer and the mask with high accuracy. Accordingly, alignment of the mask with respect to the wafer can accurately be performed. In the conventional exposure apparatus, the alignment devices are disposed between the focusing optical system and the wafer and between the focusing optical system and the mask.

Furthermore, in the conventional exposure apparatus, a high resolving power can be obtained in the vicinity of the focal position of the projection focusing optical system. Accordingly, the position of the surface of the wafer that is being exposed must be located in the vicinity of the focal position of the projection focusing optical system. The range in the direction of the optical axis in which the projection focusing optical system exhibits a high resolving power is called the "depth of focus(DOF)." The depth of focus, DOF, is determined mainly by the wavelength $\lambda$ of the exposing light and the numerical aperture NA of the focusing optical system, and is expressed by the following equation:

$$DOF = k2\lambda/NA^2 \text{ (k2:constant)} \tag{2}$$

For example, if the numerical aperture is 0.5 and the constant K2 is 1 at a wavelength of 365 nm, then the DOF is 1.5 $\mu$m.

In order to expose the wafer surface while the wafer surface is positioned within the range of the depth of focus, a device for detecting the position of the wafer surface in the direction of the optical axis of the projection focusing optical system (also referred to as "focal point detection device," because the device detects the vertical position of the wafer in order to position the wafer at the focal point) is installed in the exposure apparatus. Through this device, the position of the wafer in the direction of the optical axis is detected, and the position of the wafer in the direction of the optical axis is adjusted by the wafer stage so as to position the wafer surface at an appropriate position within the DOF.

FIG. 12 schematically shows an example of such a focal point detection device. The detection scheme illustrated in FIG. 12 is generally referred to as the triangulation method. In this method, wafer 6 is illuminated with illuminating light 91, which is obliquely incident on the wafer 6 through mirror 95, and light 92 reflected from the wafer is detected by a photo-detector 96 through mirror 95. When the wafer position changes, the optical path of the reflected light changes, which in turn changes the position of the reflected light at the photo-detector 96. Thus, by detecting such position changes at the photo-detector 96, the position of the wafer can be measured. A one-dimensional or two-dimensional position detection sensor is used as the photo-detector.

Such a focal point detection device is advantageous because the position on the wafer at which the focal point detection device detects the position of the surface (i.e., the position illuminated by detection light) can be set inside the area being exposed or in the vicinity thereof. In the conventional exposure apparatus, the focal point detection device is installed between the focusing optical system and the wafer.

FIGS. 13 and 14 are schematic diagrams illustrating examples of conventional exposure apparatus that uses the i-line. This apparatus is constructed mainly from a light source and illumination optical system (not shown in the figures), a stage 15 for holding mask 14, a projection focusing optical system 13, a stage 17 for holding wafer 16, alignment devices 18 and 18' (FIG. 13), and a focal point detection system 18" (FIG. 14). The mask 14 has a mask pattern thereon, which is to be transferred onto the wafer 16 without reduction or with a certain reduction factor. The projection focusing optical system 13 is constructed of a plurality of lenses, etc., in such a way as to focus the image of the mask pattern on the mask 14 onto the wafer 16. The focusing optical system 13 has a field of view, the diameter of which is about 20 mm, and is constructed in such a way as to transfer the mask pattern onto the wafer 16 at once. The alignment detection devices 18 and 18' detects the positions of respective alignment marks on the mask and the wafer. The focal point detection system 18" emits a light beam 91, such as visible light beam, towards the wafer 16 obliquely, and detects the light beam 92 reflected from the surface of the wafer 16.

In the conventional exposure apparatus using the i-line or the like, as described above, the projection focusing optical system can be constructed of leases. Accordingly, an optical system with a field of view of 20 mm square or larger can be designed. Thus, it has been possible to expose a desired region (e.g., a region corresponding to two (2) semiconductor chips) at once.

On the other hand, in designing a focusing optical system for X-rays in an effort to obtain a higher resolving power, it is found that the field of view needs to be reduced. Therefore, an exposure region as large as that in the above-mentioned exposure apparatus cannot be exposed at once. Accordingly, a scanning method has been proposed. In the scanning method, a semiconductor chip area of 20 mm square or larger can be exposed using a focusing optical system having a small field of view by synchronously scanning the mask and the wafer during exposure. Using such a method, it is possible to expose the desired exposure region by an X-ray projection exposure apparatus.

For example, in the case of exposure by X-rays having a wavelength of 13 nm, it is possible to form the exposure field of view of the projection focusing optical system to be an annular band shape so that a high resolving power can be obtained.

FIGS. 15 and 16 schematically show examples of proposed designs of X-ray projection exposure apparatus. The X-ray projection exposure apparatus includes an X-ray source 1, a X-ray illumination optical system 2, a stage 5 for holding a mask 4, an X-ray projection focusing optical system 3, and a stage 7 for holding a wafer 6. The mask 4 has a mask pattern thereon, which is to be transferred onto the wafer 6 without reduction or with a certain reduction factor. The projection focusing optical system 3 includes a plurality of reflective mirrors 31–34, etc., in such a way as to focus the mask pattern on the wafer 6. The focusing optical system has an annular band shape field of view so as to transfer a portion of the mask pattern on the mask 4 having an annular band shape onto the wafer 6. During exposure, the mask 4 is illuminated with X-rays 91, and the reflected X-rays 92 are guided towards the wafer 6 via the X-ray projection focusing optical system 3. The mask 4 and wafer 6 are synchronously scanned with the X-rays at respective constant speeds to expose an entire predetermined region (e.g., a region corresponding to one semiconductor chip).

In this example of X-ray projection exposure apparatus, due to various constraints to the design of X-ray optical systems, the reflective mirror closest to the wafer (mirror 34 in FIG. 15 or mirror 31 in FIG. 16) needs to be disposed in proximity to the wafer. Accordingly, it is difficult to install the optical systems for alignment devices and the focal position detection device between the focusing optical system and the wafer. In this connection, the following two problems are worth noting. (1) If the position of the reflective mirror closest to the wafer among the reflective mirrors of the focusing optical system is removed from the wafer in order to increase the gap between the wafer and the closest reflective mirrors, the focusing performance of the focusing optical system suffers, and as a result, the desired pattern with a sufficient resolution cannot be obtained. (2) If the reflective mirror closest to the wafer among the reflective mirrors of the focusing optical system is made thinner in order to increase the gap, the rigidity of such a mirror drops, making manufacture of a high-precision mirror difficult. Thus, in the design of the X-ray exposure apparatus, it is difficult to increase the gap between the mirror closest to the wafer and the wafer without sacrificing the optical characteristics of the focusing optical system.

Furthermore, because no operational X-ray projection apparatus has yet been developed, there is no specific proposals as to the arrangement of the above-mentioned focal point detection system (system for detecting the position of the wafer surface in the optical axis direction).

SUMMARY OF THE INVENTION

Accordingly, the present invention is directed to an X-ray projection exposure apparatus that substantially obviates the problems due to limitations and disadvantages of the related art.

An object of the present invention is to provide an X-ray projection exposure apparatus in which alignment detection can be accomplished without sacrificing the optical characteristics of the focusing optical system.

Another object of the present invention is to provide an X-ray projection exposure apparatus in which focal point detection can be accomplished without sacrificing the optical characteristics of the focusing optical system.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides an X-ray projection exposure apparatus, including an X-ray source that generates X-rays; a mask stage configured to hold a mask having a mask pattern; an X-ray illumination optical system that directs the X-rays generated by the X-ray source towards the mask; a substrate stage configured to hold a substrate; an X-ray projection focusing optical system that receives the X-rays from the mask and projects and focuses an image of the mask pattern onto the substrate, the X-ray projection focusing optical system including a plurality of reflective mirrors that reflect X-rays, the reflective mirror closest to the substrate stage being adjacent the substrate stage; and a position detection optical system that optically detects a position of the substrate, wherein the X-ray projection focusing optical system is configured to accommodate at least a portion of the position detection optical system.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
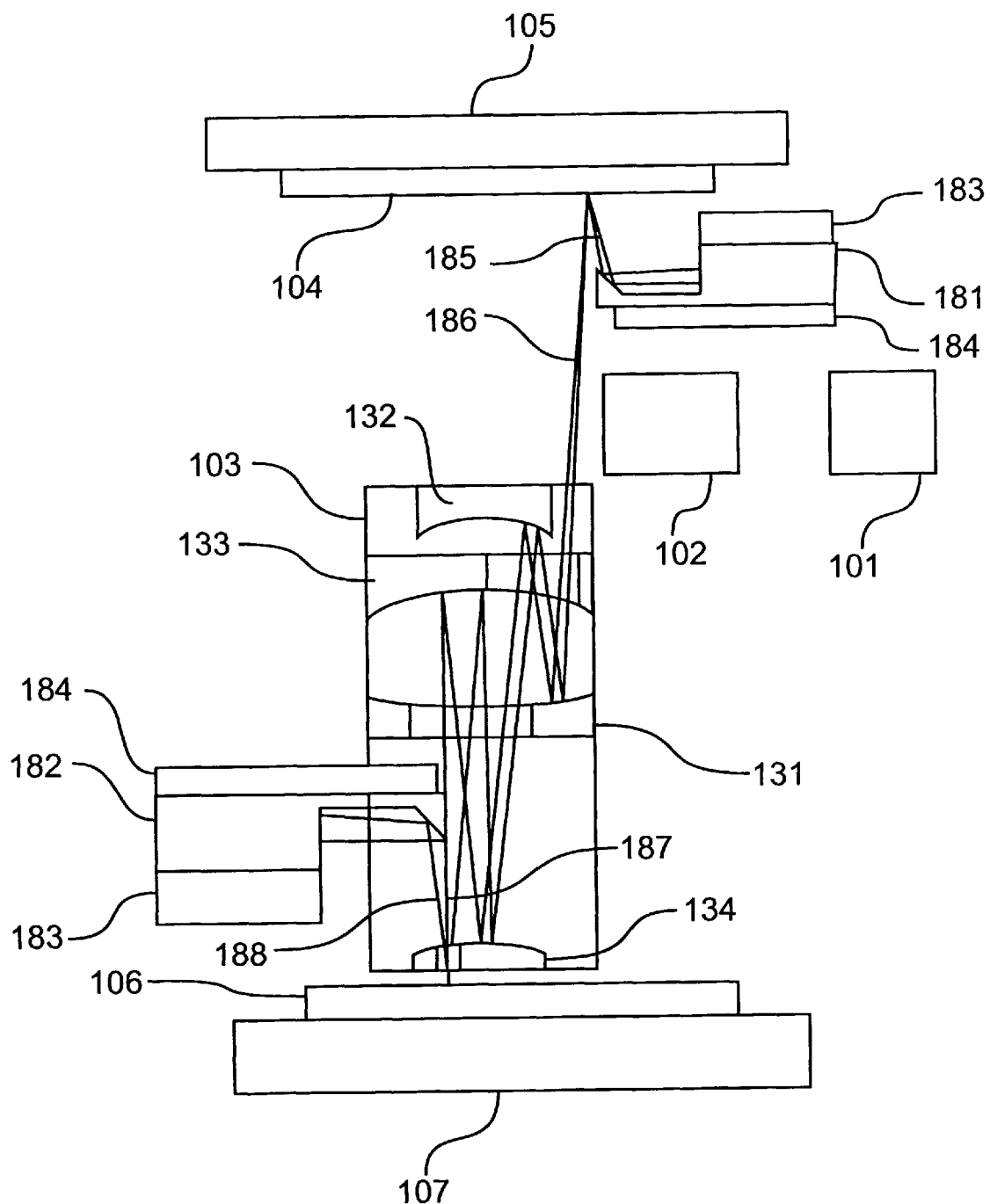
FIG. 1 is a schematic diagram which illustrates an X-ray projection exposure apparatus according to a first preferred embodiment of the present invention.

An X-ray projection exposure apparatus of the present invention includes an X-ray source, and an X-ray illumination optical system which directs X-rays generated by the X-ray source towards a mask having a prescribed mask pattern. An X-ray projection focusing optical system receives the X-rays from the mask and projects and focuses an image of the mask pattern onto a substrate. A mask stage holds the mask, a substrate stage holds the substrate, and a position detection optical system optically detects alignment marks formed on the mask and the substrate. The projection focusing optical system includes a plurality of reflective mirrors that reflect X-rays, and at least a portion of the position detection optical system is disposed among the plurality of reflective mirrors. At least the portion of the position detection optical system may be disposed between the reflective mirror closest to the substrate and the reflective mirror second closest to the substrate among the plurality of reflective mirrors which constitutes the projection focusing optical system. The position detection optical system may include an illumination optical system that illuminates a mark formed on the mask. The light reflected from the mark on the mask may be guided towards a mark on the substrate via at least some of the reflective mirrors of the X-ray projection focusing optical system. A detection optical system may detect the marks on the substrate. The position detection system may include a motion mechanism. The numerical aperture of the position detection optical system may be about ½ or less. At least a portion of the position detection optical system disposed among the plurality of reflective mirrors may include a half-mirror. The position detection optically system may include a temperature adjustment mechanism.

In another aspect, an X-ray projection exposure apparatus of the present invention includes an X-ray source and an illumination optical system which directs X-rays generated by the X-ray source towards a mask having a prescribed mask pattern. A projection focusing optical system receives the X-rays from the mask and projects and focuses an image of the mask pattern onto a substrate. A substrate stage holds the substrate, and a position detection device optically detects the position of the substrate in the direction of the optical axis of the projection focusing optical system. The projection focusing optical system includes a plurality of reflective mirrors that reflect X-rays, and at least a portion of the position detection device is disposed among the plurality of reflective mirrors. At least a portion of the position detection device may be disposed between the reflective mirror closest to the substrate and the reflective mirror second closest to the substrate among the plurality of reflective mirrors constituting the projection focusing optical system. A through-hole may be formed in the reflective mirror closest to the substrate, and detection light used for position detection will pass through the through-hole. A motion mechanism may be installed in the position detection device, and a temperature adjustment mechanism may be installed in the position detection device.

In still another aspect of the present invention, an X-ray projection exposure apparatus includes an X-ray source, an illumination optical system which directs X-rays generated by the X-ray source towards a mask having a prescribed mask pattern, a projection focusing optical system which receives the X-rays from the mask and projects and focuses an image of the mask pattern onto a substrate, a substrate stage which holds the substrate, and a position detection mechanism which optically detects the position of the substrate in the direction of the optical axis of the projection focusing optical system. The projection focusing optical system may be constructed of a plurality of reflective mirrors that reflect X-rays, and the reflective mirror that is closest to the substrate has a space which provides the passage of detection light for the position detection mechanism in its back surface facing the substrate. The space which provides the passage of the detection light for the position detection mechanism may be a tapered part formed in the reflective mirror that is closest to the substrate, or a groove or through-hole formed in the reflective mirror that is closest to the substrate.

The present invention also provides an X-ray projection exposure apparatus including an X-ray source, an illumination optical system which directs X-rays generated by the X-ray source onto a mask having a prescribed mask pattern, a projection focusing optical system which receives the X-rays from the mask and projects and focuses an image of the mask pattern onto a substrate, a substrate stage which holds the substrate, and a position detection mechanism which optically detects the position of the substrate in the direction of the optical axis of the projection focusing optical system. The projection focusing optical system includes a plurality of reflective mirrors that reflect X-rays, and the reflective mirror that is closest to the substrate among the plurality of reflective mirrors may be held by a holder which has a space providing the passage of detection light for the position detection mechanism in a surface of the holder facing the substrate. The space which provides the passage of the detection light for the position detection mechanism may be a tapered part formed in the holder, or a groove or through-hole formed in the holder.

Reference will now be made in detail to the preferred embodiments of the present invention, examples of which are illustrated in the accompanying drawings.

First Preferred Embodiment

FIG. 1 schematically shows an X-ray projection exposure apparatus according to a first preferred embodiment of the present invention. This embodiment includes an X-ray source 101, an X-ray illumination optical system 102, an X-ray projection focusing optical system 103, a stage 105 which holds a mask 104, a stage 107 which holds a wafer 106, and alignment detection devices 181 and 182. A mask pattern, which is to be transferred onto a wafer 106 without magnification or with a certain magnification, is formed on the mask 104. The X-ray projection focusing optical system 103 includes a plurality of reflective mirrors arranged so as to focus the image of the mask pattern on the mask 104 onto the wafer 106. The X-ray projection focusing optical system 103 has an annular band shape field of views so that a portion of the mask pattern on the mask 104 is transferred onto the wafer 106 at a time.

Figure 15:
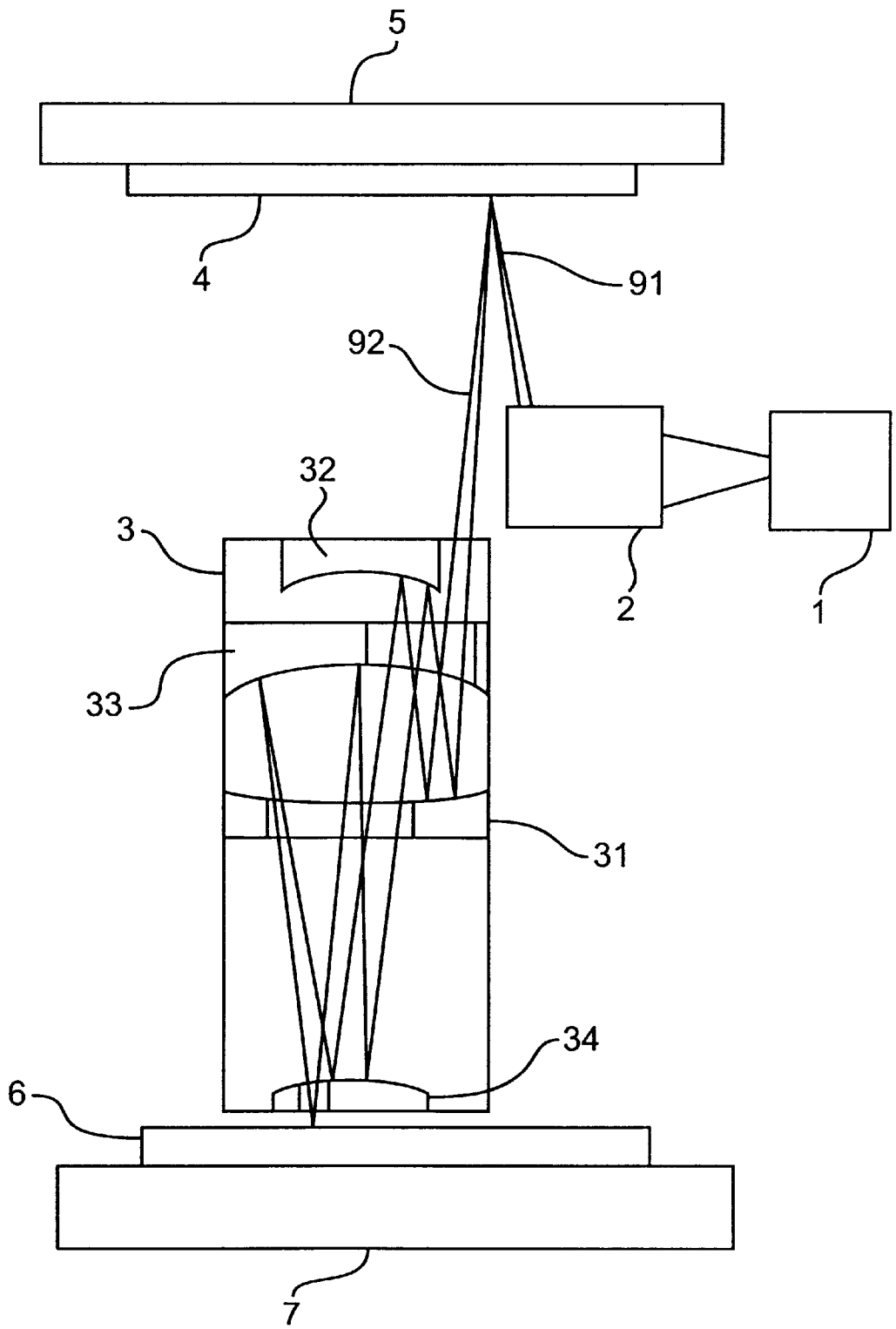
FIG. 15 is a schematic diagram showing a proposed configuration of an X-ray projection exposure apparatus.
Figure 16:
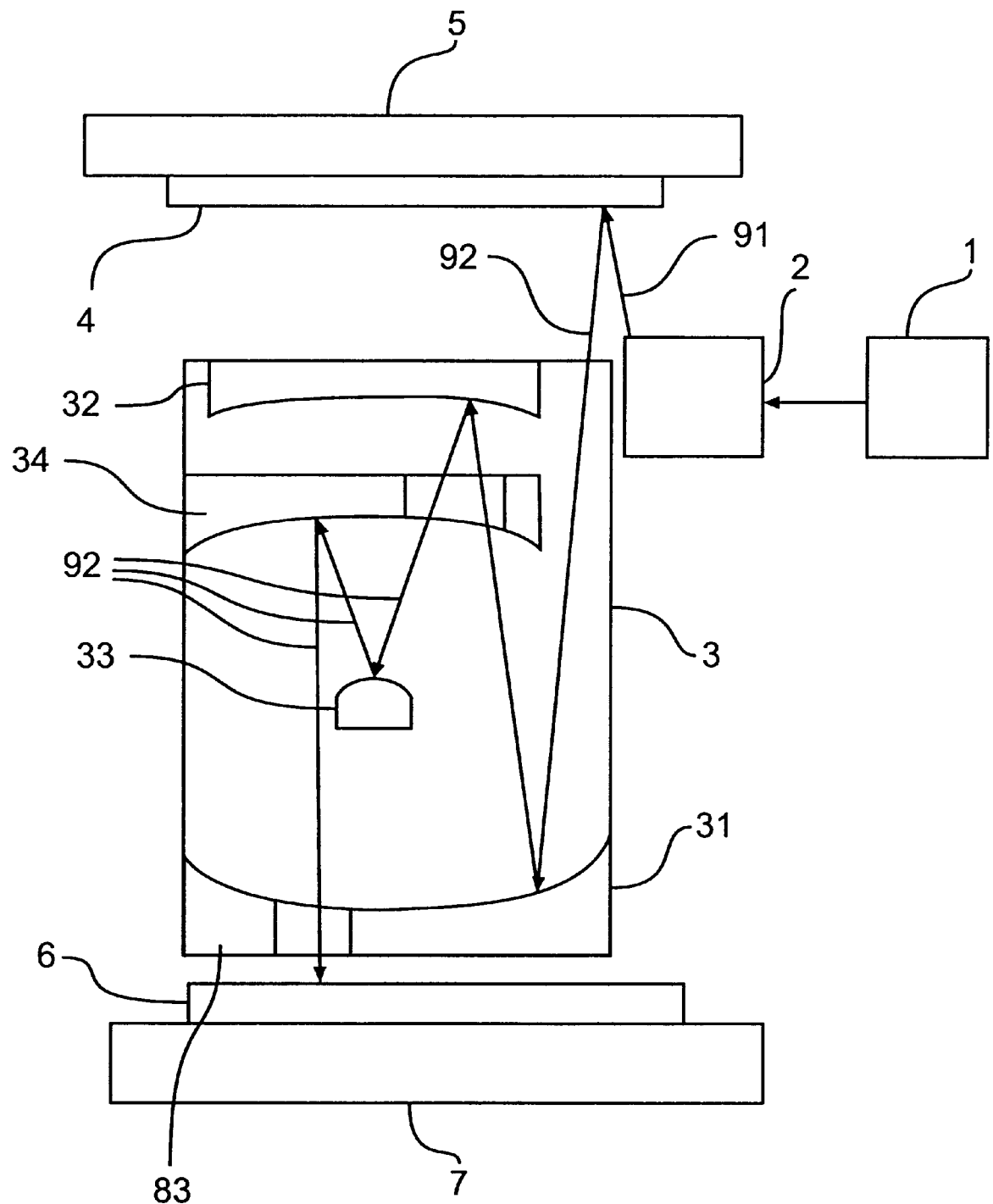
FIG. 16 is a schematic diagram which illustrates another proposed configuration of an X-ray projection exposure apparatus.

During exposure, a desired exposure region on the wafer 106 is exposed by synchronously scanning the mask 104 and wafer 106 with the X-rays from the X-ray illumination optical system 102 at respective constant speeds. In the present preferred embodiment, a laser plasma X-ray source is used as the X-ray source 101; the exposure wavelength is set at 13 nm, and a reflective type mask is used as the mask 104, with the transfer magnification (reduction factor) being ¼, for example. Since the transfer magnification is ¼, the scanning speed of the wafer stage is set at one quarter of the scanning speed of the mask stage. In FIG. 1, the optical paths of the X-ray beam used as X-ray exposing light is not illustrated to avoid complication of the figure. The exposing optical paths are similar to those depicted in FIG. 15.

The X-ray projection focusing optical system 103 includes a plurality of reflective mirrors 131 through 134 which reflect X-rays. In order to improve the X-ray reflectivity of the reflective mirrors, the surfaces of the mirrors are preferably coated with a multi-layer film.

The alignment detection devices 181 and 182 (alignment detection system) are configured to optically detect the positions of alignment marks on the mask 104 and wafer 106. This system includes an illumination optical system as alignment detection device 181 for illuminating with detection light an alignment mark on the mask 104 and an alignment mark on the wafer 106 and a detection optical system as alignment detection device 182 for detecting the detection light that has interacted with these alignment marks. In the present preferred embodiment, a device that performs alignment using a field-image-alignment system (FIA system) is employed as the alignment devices. However, other types of devices may also be used.

In this configuration, because the detection light used for alignment detection is reflected by the reflective mirrors of the X-ray projection focusing optical system, the alignment detection that includes the effects of the projection focusing optical system can be performed, thereby providing for superior alignment detection mechanism. When the X-ray projection focusing optical system is constructed of the reflective mirrors as in the present invention, the light used for alignment detection (white light, for example) also is free from aberration so that good alignment detection can be performed.

In the present preferred embodiment, as shown in FIG. 1, the alignment mark on the mask 104 is illuminated with detection light 185 by the illumination optical system as alignment detection device 181, and the detection light 186 reflected from the mask 104 is successively reflected by the reflective mirrors 131 through 134 of the X-ray projection focusing optical system 103 so as to be guided towards the alignment mark on wafer 106 as detection light 187. Then, the light 188 reflected from the surface of the wafer 106 is detected by the detection optical system as alignment detection device 182. This way, the image of the alignment mark on the mask 104 are projected onto the wafer 106 through the X-ray projection focusing optical system 103. This projected image and the alignment mark on the wafer are together detected by the detection optical system as alignment detection device 182. As a result, the positional relationship between the mask 104 and the wafer 106 can be obtained from the positional relationship between the alignment mark on the wafer and the projected image of the alignment mark on the mask.

As shown in FIG. 1, a portion of the detection optical system as alignment detection device 182 detecting the image of the alignment mark on the wafer 106 is disposed among the plurality of the reflective mirrors constituting the X-ray projection focusing optical system 103 (i.e., inserted into the X-ray projection focusing optical system 103). Accordingly, detection light from the alignment mark on the wafer 106 can be directed to the detection optical system as alignment detection device 182 without necessitating an extra gap between the reflective mirror 134 and wafer 106, and superior alignment detection can be performed.

In the present preferred embodiment, a reflective mirror of the detection optical system 182 for detecting the detection light from the alignment mark on the wafer 106 is disposed between the reflective mirrors 131 and 134. However, there is no particular restriction on which part of the alignment device is disposed inside the X-ray projection focusing optical system 103. Also, it is sufficient if at least some portion of the detection optical system is disposed between two reflective mirrors in the X-ray projection focusing optical system 103 so that the detection light from the alignment mark on the wafer 106 can be detected. Furthermore, such a portion of the detection optical system may be disposed at any location as along as the detection optical system can extract the detection light that has interacted with the alignment mark on the wafer 106. However, if such a portion is disposed between the reflective mirrors 131 and 134, the detection optical system as alignment detection device 182 of the alignment device can be installed in the vicinity of the wafer 106. Thus, the configuration of the present preferred embodiment is relatively preferable because a deterioration in the S/N ratio, which may occur by the intensity drop in the detection light through reflections at additional reflective mirrors, can be prevented.

Figure 2:
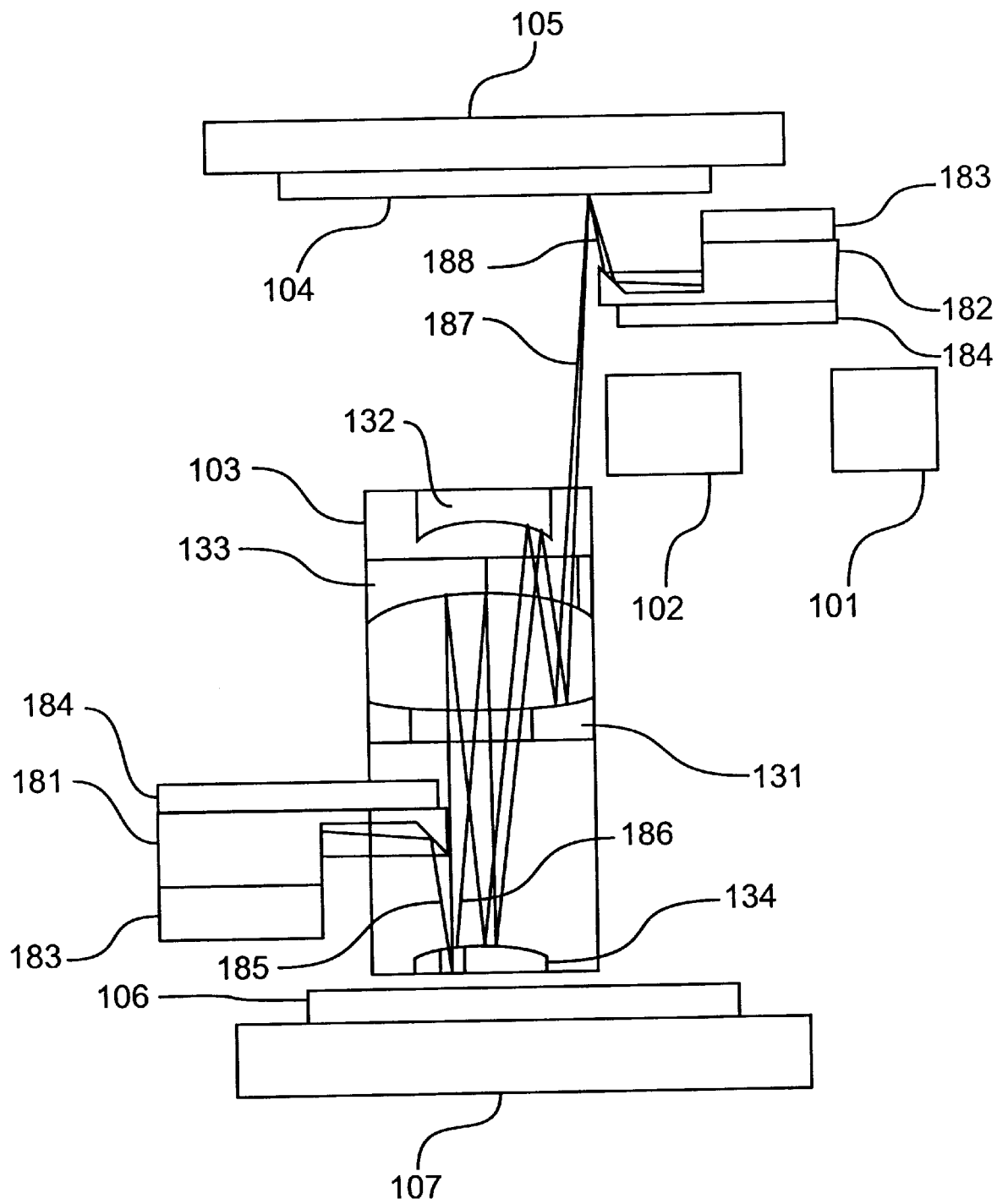
FIG. 2 is a schematic diagram which illustrates an X-ray projection exposure apparatus according to a modified first preferred embodiment of the present invention.

The illumination optical system as alignment detection device 181 and the detection optical system as alignment detection device 182 may also be installed in the reversed configuration. FIG. 2 schematically illustates such a configuration. In the apparatus shown in FIG. 1, an alignment mark formed on wafer 106 is illuminated with detection light 185 by the illumination optical system as alignment detection device 181, and the detection light 186 reflected from the wafer 106 is further reflected by the reflective mirrors 131 through 134 of the X-ray projection focusing optical system 103 so as to be guided to the mask 104. The detection light 188 reflected from the mask 104 is detected by the detection optical system as alignment detection device 182.

As a slight modification, it is also possible to detect the alignment mark on the wafer 106 directly without interaction with the mask 104. To this end, it is sufficient if the detection light from the alignment mark on the wafer 106, which has passed through the X-ray projection focusing optical system 103, is guided directly to the detection optical system as alignment detection device 182 without interacting with the mask 104.

In FIG. 2, the portion of the illumination optical system as alignment detection device 181 is disposed among the plurality of mirrors of the X-ray projection focusing optical system 103. In this example, this penetrating portion includes a reflective mirror for reflecting the detection light emitted from the illumination optical system as alignment detection device 181. As in the case of FIG. 1 described above, the detection light can be directed to a desired position on the wafer by disposing the portion of the alignment device among the plurality of reflective mirrors in a similar manner to that in FIG. 1. Accordingly, the alignment device can be constructed without necessitating an extra gap between the reflective mirror 134 and wafer 106.

In the case of FIG. 2, a portion of the illumination optical system as alignment detection device 181 is inserted between the reflective mirrors 131 and 134, and therefore, the illumination optical system as alignment detection device 181 can be installed in the vicinity of the wafer 106. Thus, the configuration of this example is preferable because a deterioration in the S/N ratio, which may occur by the intensity drop in the detection light through reflections at additional reflective mirrors, can be prevented.

In these cases where the alignment light (detection light) is reflected by the reflective mirrors of the X-ray focusing optical system, it is desirable to arrange the system so that there is no interference between the light incident on the wafer and the reflected light. As a means of accomplishing this, it is desirable that the numerical aperture of the optical system of the alignment device be set at about half of the numerical aperture of the X-ray projection focusing optical system or less. Light beams 185 through 188 of the alignment device are shown in FIG. 1. Here, since the numerical aperture of the alignment optical system is set at half of the numerical aperture of the X-ray projection focusing optical system, the light 187 incident on the wafer and the reflected light 188 do not interfere with each other. Similarly, in FIG. 2, the light 185 and light 186 do not interfere.

Figure 3:
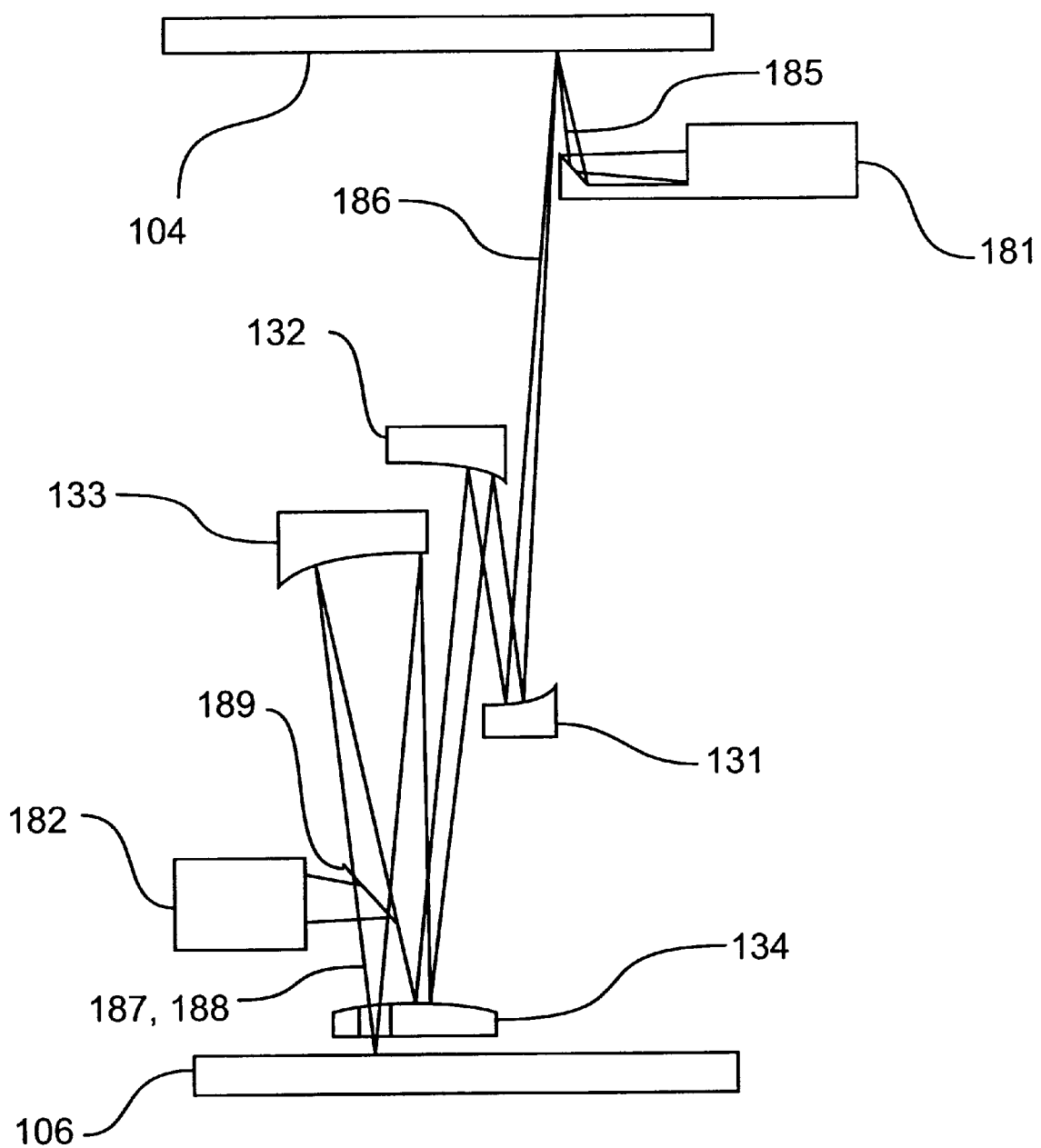
FIG. 3 is a schematic diagram which illustrates an X-ray projection exposure apparatus according to another modified first preferred embodiment of the present invention.

Furthermore, half-mirrors may also be used in a portion of the alignment optical system. FIG. 3 shows a portion of an apparatus in which a half-mirror 189 is used in a portion of the detection optical system. As a result of the use of such an arrangement, it is possible for the light incident on the wafer and the reflected light to share a portion of their light paths, so that the marks can be detected. If a pellicle mirror is used as a half-mirror, the effect of refraction by the half-mirror is reduced; accordingly, such use is desirable. Of course, it is also possible to construct the alignment device as shown in FIG. 1, and to use half-mirrors as the inserting portion of the detection optical system.

It is desirable that the alignment marks be disposed at the periphery of the exposure field of view of the X-ray focusing optical system. Especially in the case of an annular band-form field of view, the marks on the mask can be accurately projected onto the wafer if marks are disposed at the periphery at both ends in the circular-arc direction of the annular band.

In cases where a portion of the alignment detection device blocks the X-rays constituting the exposing light, it is desirable that a motion mechanism 183 be installed in the alignment detection device 181, 182 (FIGS. 1 and 2), so that the alignment device can be retracted during exposure. For example, mechanical means can be used for this motion mechanism. In such a case, all or part of the alignment detection device can be retracted during exposure. In FIGS. 1 and 2, motion mechanism 183 are installed in each of the illumination optical system as alignment detection device 181 and the detection optical system as alignment detection device 182. However, it is also possible to install such a motion mechanism in only one of these systems, if desired. Furthermore, it is also possible to detect marks at a plurality of points on the mask and the wafer using the motion mechanism 183 by changing the position of the alignment devices 181, 182. In such a case, it is desirable that the alignment detection device 181, 182 be caused to undergo parallel movement within a plane perpendicular to the optical axis of the projection focusing optical system 103. Furthermore, when a plurality of marks are detected, the wafer stage and the mask stage may be synchronized. When a plurality of marks on the wafer are detected with respect to a single mark on the mask, it is possible to perform measurements with only the mask stage being moved.

Furthermore, it is also possible to install a plurality of alignment detection devices to detect a plurality of points on the wafer.

A temperature of adjustment mechanism 184 may also be installed in the alignment detection device 181, 182. Water cooling, a cooling medium or a Peltier element, etc., may be used as such a temperature adjustment mechanism. In this way, the heat generated from the alignment device can be suppressed; accordingly, the effect of heat on the projection focusing optical system can be suppressed, so that thermal deformation of projection focusing optical system can be prevented. As a result, the desired small aberration of the projection focusing optical system can easily be maintained.

When exposure was performed using the above-mentioned apparatus, it is possible to project and transfer the mask pattern onto the wafer at a desired position. As a result, it becomes possible to obtain a resist pattern with a minimum size of 0.1 μm in a desired position over the entire surface of a region corresponding to one or more semiconductor chips on the wafer, so that high-precision devices can be manufactured.

On the other hand, in the conventional designs of X-ray projection exposure apparatus described in the background section above, since the X-ray projection focusing optical system sacrifices its focusing power in order to allow the installation of an alignment device, the focusing performance is poor, and a resist pattern of the desired shape cannot be obtained in the exposed region.

By using the X-ray projection exposure apparatus of the present invention, as described above, it is possible to install an alignment device while maintaining the desired small aberration of the projection focusing optical system. Furthermore, by installing a motion mechanism, a plurality of points on the wafer can be detected. As a result, the pattern on the mask can be projected and transferred onto the wafer in a desired position, so that high-precision devices can be manufactured.

Second Preferred Embodiment

Figure 4:
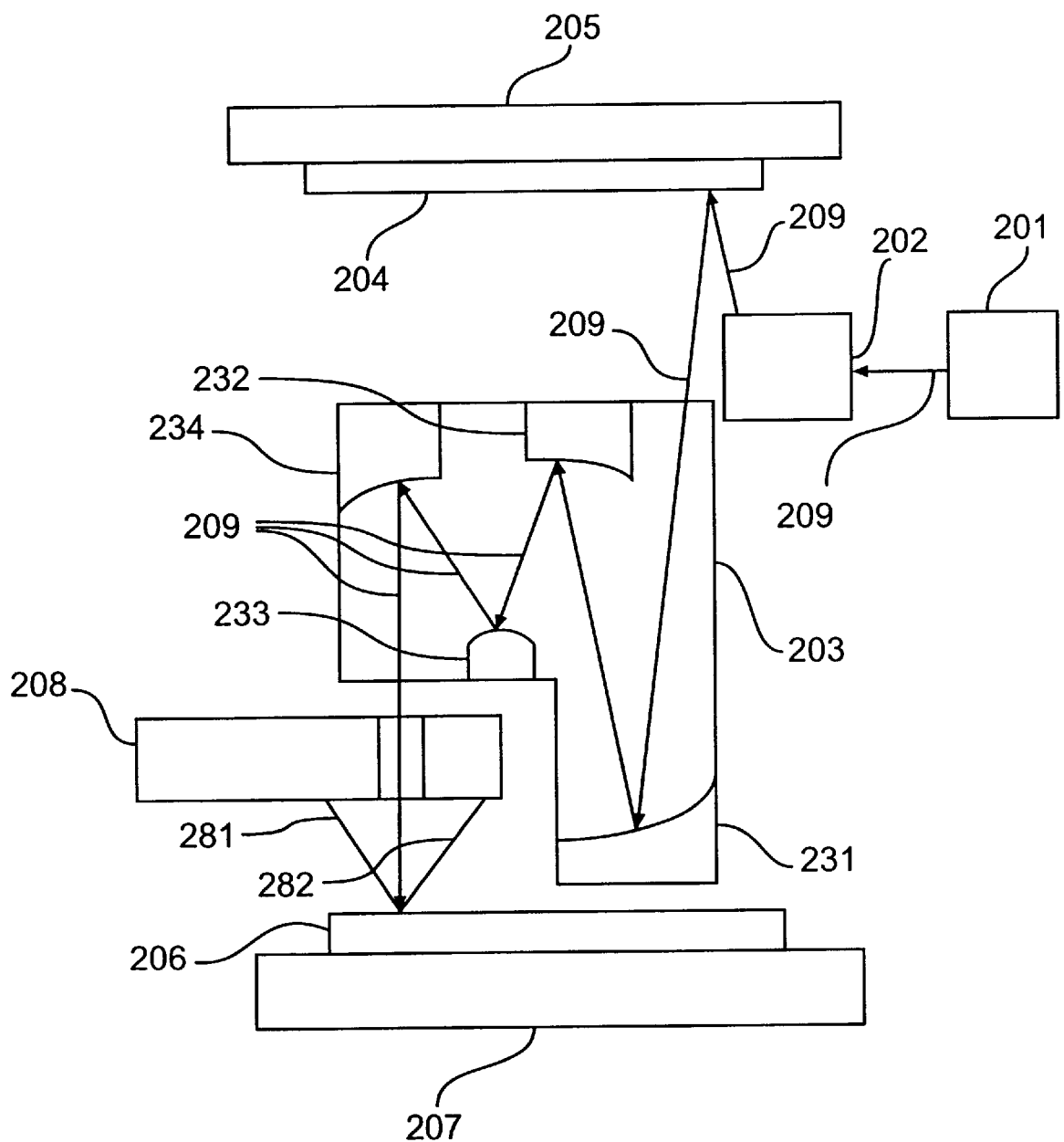
FIG. 4 is a schematic diagram which illustrates an X-ray projection exposure apparatus according to a second preferred embodiment of the present invention.

A schematic diagram of an X-ray projection exposure apparatus according to a second preferred embodiment of the present invention is shown in FIG. 4.

This apparatus is constructed mainly from an X-ray source 201, an illumination optical system 202, a projection focusing optical system 203, a stage 205 which holds a mask 204, a wafer stage 207 which holds a wafer 206, and a focal point detection device 208.

A pattern, which is equal in size to the pattern that is to be drawn on the wafer, or which is to be enlarged, is formed on the mask 204. The projection focusing optical system 203 is constructed from a plurality of reflective mirrors, and is arranged so that the pattern on the mask 204 is focused on the wafer 206. The projection focusing optical system 203 has an annular band-form field of view, so that a portion of the mask pattern region of the mask 204 is transferred onto the wafer 206. A desired region is exposed by synchronously scanning the mask and the wafer at respective constant speeds during exposure. In the present preferred embodiment, for example, a laser plasma X-ray source is used as the X-ray source; the exposure wavelength is set at 13 nm, and a reflective type mask is used as the mask 204, with the transfer magnification set at ¼. Since the transfer magnification is ¼, the speed of the wafer stage is set at one-quarter of the speed of the mask-stage. The projection focusing optical system 203 is constructed from a plurality of reflective mirrors 231 through 234 that reflect X-rays. It is desirable that the surfaces of the reflective mirrors be coated with a multi-layer film in order to improve the X-ray reflectivity.

The focal point detection device 208 used in the exposure apparatus shown in FIG. 4 is a device which optically detects the surface position of the wafer. Here, a device of the type using a triangulation system in which the surface of the wafer 206 is obliquely illuminated by illuminating light 281, and the reflected light 282 is detected by a photodetector, is used. However, it is also possible to use some other type of focal point detection device. At least a portion of the focal point detection device 208 is disposed between two of the above-mentioned plurality of mirrors 231 through 234 (i.e., in the X-ray projection focusing optical system 203). As a result, the focal point detection device 208 can be installed without creating an extra gap between the wafer 206 and the reflective mirror 231 that is closest to the water among the reflective mirrors constituting the projection focusing optical system. Consequently, focal point detection can be accomplished without sacrificing the optical performance of the focusing optical system.

In this case, it is desirable that the focal point detection device 208 be installed so that the light path of the exposing X-rays 209 is not blocked. The entire focal point detection device 208 may be installed inside the projection focusing optical system 203. However, in order to prevent blocking of the exposing X-rays 209, it is desirable that a portion of the focal point detection device 208 be installed outside the projection focusing optical system 203. In the present preferred embodiment, the focal point detection device 208 is installed between the reflective mirror 231 that is closest to the wafer 206 and the reflective mirror 233 that is second closest to the wafer 206 (among the plurality of reflective mirrors 231 through 234 constituting the projection focusing optical system 203). In this case, the focal point detection device 208 can easily be installed without blocking the exposing X-rays 209. Accordingly, such an arrangement is desirable.

Figure 5:
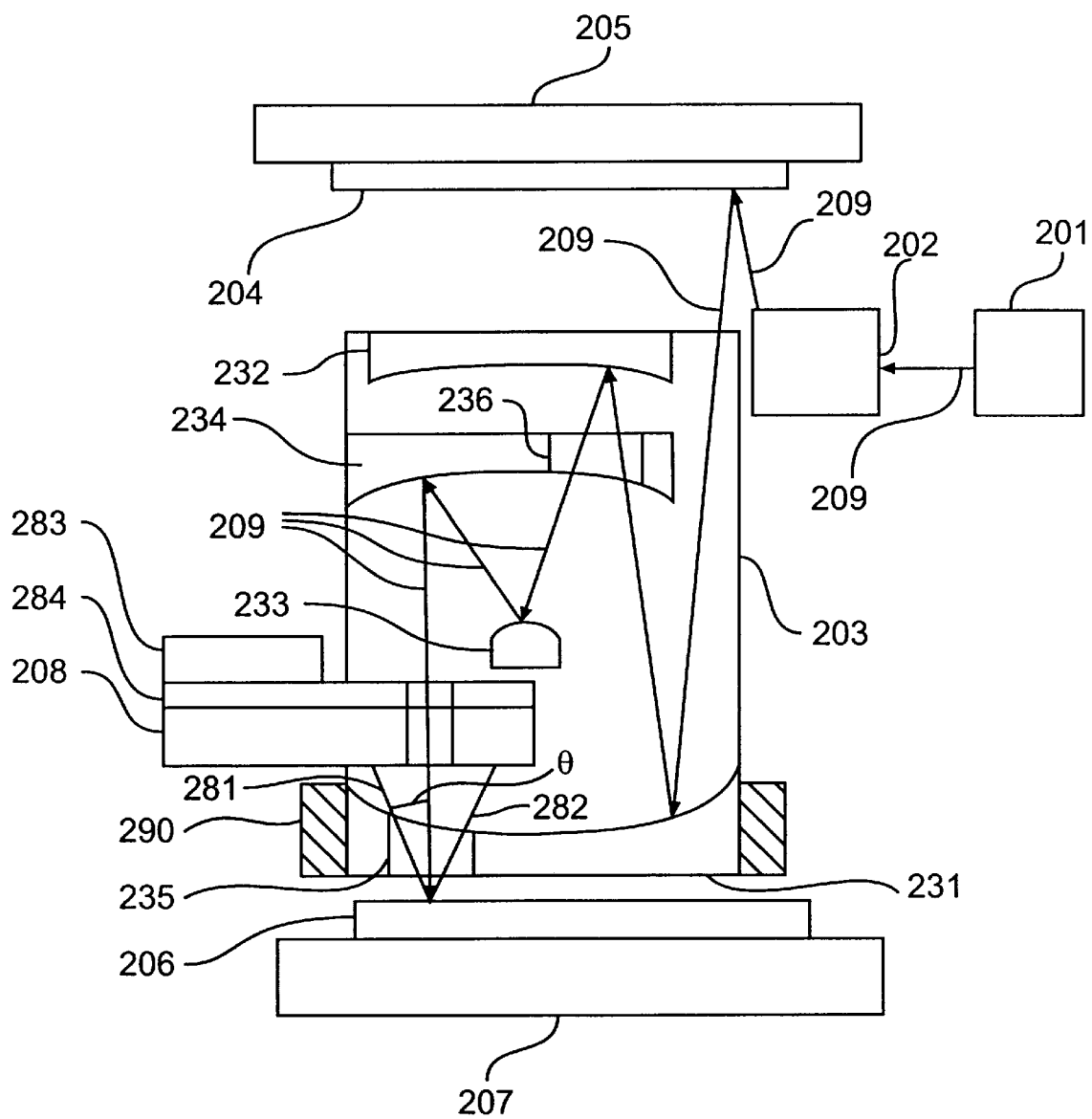
FIG. 5 is a schematic diagram which illustrates an X-ray projection exposure apparatus according to a modified second preferred embodiment of the present invention.

FIG. 5 is a schematic diagram which illustrated an X-ray projection exposure apparatus constructed according to a modified second preferred embodiment of the present invention.

The apparatus shown in FIG. 5 differs from the apparatus shown in FIG. 4 in that some of the reflective mirrors 231 and 234 have through-holes 235 and 236. Since the remaining constructions are the same as in the apparatus shown in FIG. 4, a detailed description will be omitted. These through-holes 235 and 236 are formed so that the reflective mirrors 231 and 234 do not block the exposing X-rays. In such a case, the focal point detection device 208 is disposed so that the light paths 281 and 282 pass through the through-hole 235 in the reflective mirror 231 closest to the wafer. In this case, it is desirable that the through-hole 235 have a size and shape such that the incident light 281 and reflected light 282 are not blocked.

Furthermore, it is also possible to form a through-hole which is used for the passage of the light path of the focal point detection device 208 in the reflective mirror 231 separately from the through-hole 235 through which X-rays pass. Moreover, although this depends on the focal point detection system used, in the case of a system in which light is obliquely incident on the wafer as in the present preferred embodiment, it is also desirable to form a through-hole in a holder 290 which holds the reflective mirror 231 (depending on the angle of incidence θ in FIG. 5), so that light used for focal point detection can pass through.

If a motion mechanism 283 is installed in the focal point detection device 208, a plurality of points on the wafer can be detected, accordingly, such installation is desirable. This motion mechanism can be performed mechanically. In this case, it is desirable that the focal point detection device 208 be caused to undergo parallel movement in a plane perpendicular to the optical axis of the projection focusing optical system 203. In this way, tilting of the wafer surface can also be detected. Furthermore, it is also possible to install a plurality of focal point detection devices to detect a plurality of points on the wafer.

Also, it is desirable that a temperature adjustment mechanism 284 be installed in the focal point detection device 208.

Water cooling, a cooling medium or a Peltier element, etc., may be used as such a temperature adjustment mechanism. In this way, the heat generated from the focal point detection device can be suppressed; accordingly, the effect of heat on the projection focusing optical system can be suppressed, and thermal deformation of the projection focusing optical system can be suppressed. As a result, the desired small aberration of the projection focusing optical system can easily be maintained. For example, it is desirable that the temperature of the focal point detection device be controlled to within ±0.1° C. Furthermore, these devices (a temperature adjustment mechanism 284 and/or motion mechanism 283) may also be installed in the apparatus shown in FIG. 4.

The apparatus shown in FIG. 4 is advantageous in that a large installation space may be obtained for the focal point detection device. However, if the reflective mirrors become axially asymmetrical, measurement may become difficult. Furthermore, there may be cases in which assembly and adjustment (especially adjustment for eccentricity) become difficult. Accordingly, in cases where the above-mentioned problems arise, the use of the apparatus shown in FIG. 5 is preferable in constructing a high-performance projection focusing optical system.

When exposure is performed using the above-mentioned apparatuses, detection of the focal position of the wafer can be accomplished with a high degree of precision. As a result, resist patterns with a minimum line-width of 0.1 μm can be obtained with a desired shape throughout a region corresponding to one or more semiconductor chips on the wafer. On the other hand, in the conventional designs of X-ray projection exposure apparatus described in the background section above, resist patterns with a desired shape cannot be obtained in some portion of the exposed region.

By using the X-ray projection exposure apparatus of the present invention, as described above, it is possible to install a focal point detection device while maintaining the desired small aberration of the projection focusing optical system. Furthermore, it is possible to detect a plurality of points on the wafer by installing the motion mechanism. As a result, the surface position of the wafer can be adjusted to within the range of the depth of focus of the projection focusing optical system, and resist patterns with a desired shape can be formed in desired regions.

Third Preferred Embodiment

Figure 6:
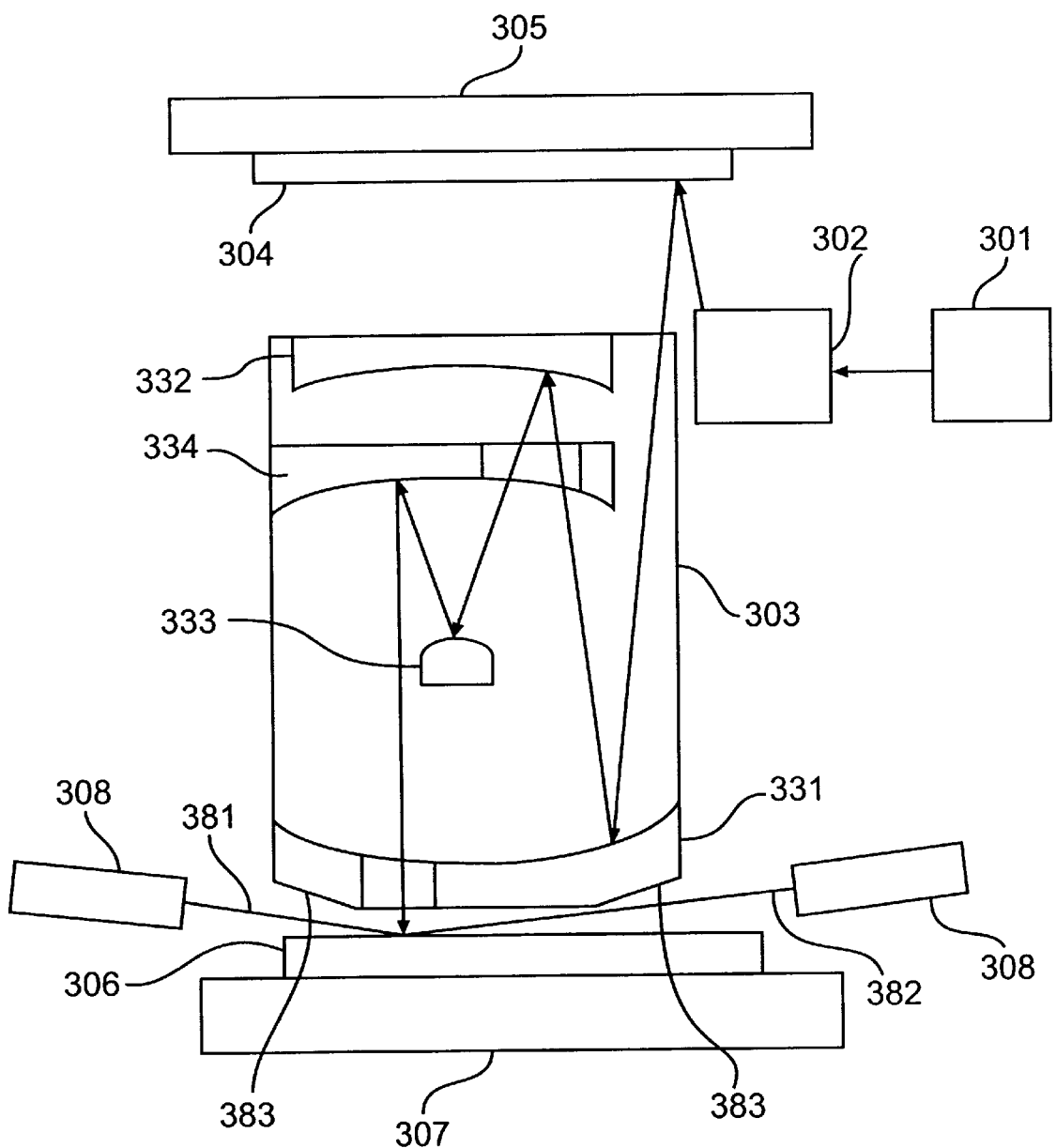
FIG. 6 is a schematic diagram which illustrates an X-ray projection exposure apparatus according to a third preferred embodiment of the present invention.

A schematic diagram of an X-ray projection exposure apparatus constructed according to a third preferred embodiment of the present invention is shown in FIG. 6.

This apparatus is constructed mainly from an X-ray source 301, an illumination optical system 302, a projection focusing optical system 303, a stage 305 which holds a mask 304, a wafer stage 307 which holds a wafer 306, and a focal point detection device 308. A pattern, which is equal in size to the pattern that is to be drawn on the wafer, or which is to be enlarged, is formed on the mask 304. The projection focusing optical system 303 is constructed of a plurality of reflective mirrors, and is arranged so that the pattern on the mask 304 is focused on the wafer 306. The projection focusing optical system 303 has an annular band-form field of view, so that a portion of the mask pattern region of the mask 304 is transferred onto the wafer 306. A desired region is exposed by synchronously scanning the mask and wafer at respective constant speeds during exposure. In the present preferred embodiment, for example, a laser plasma X-ray source is used as the X-ray source; the exposure wavelength is set at 13 nm; and a reflective type mask is used as the mask 304, with the transfer magnification set at ¼. Since the transfer magnification if ¼, the speed of the wafer stage is set at one-quarter of the speed of the mask stage. The projection focusing optical system 303 is constructed of a plurality of non-spherical reflective mirrors 331 through 334. It is desirable that the surfaces of the reflective mirrors be coated with a multi-layer film in order to improve the reflectivity.

The focal point detection device 308 used in the present preferred embodiment is a device which optically detects the surface position of the wafer. Here, a device of the type using a triangulation system in which the surface of the wafer 306 is obliquely illuminated by illuminating light 381, and the reflected light 382 is detected by a photo-detector, is used. However, it is also possible to use some other type of focal point detection device.

A tapered portion (taper) 383 is formed on the back surface of the reflective mirror 331, which is located closest to the wafer among the reflective mirrors 331 through 334. Accordingly, the focal point detection device 308 can be installed without any interference between the detection light beams 381 and 382 and the reflective mirror 331.

Figure 7A:
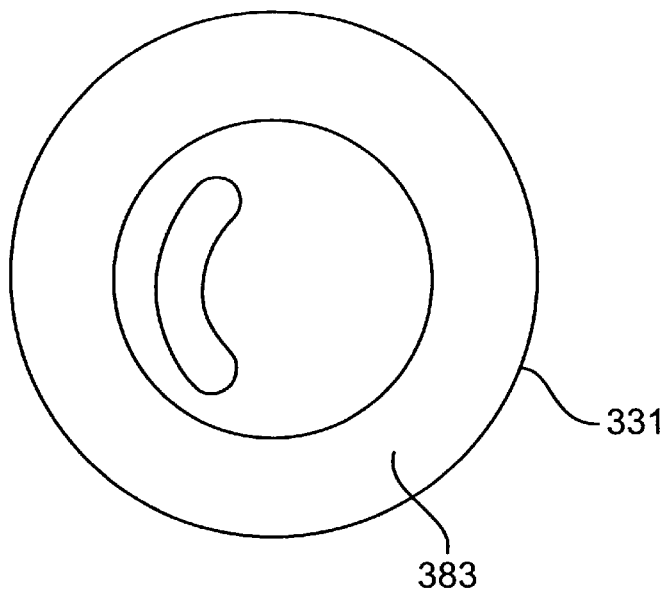
FIGS. 7A and 7B schematically illustrate a configuration of the third preferred embodiment adjacent the reflective mirror 31.
Figure 7B:
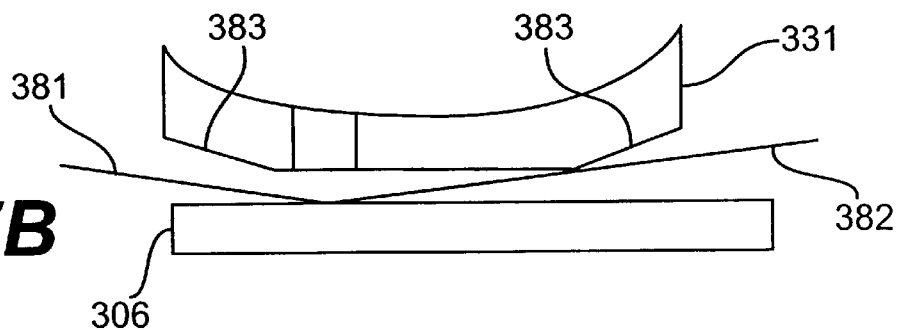

An enlarged schematic diagram in the vicinity of the reflective mirror 331 and water 306 is shown in FIG. 7B, and a plan view of the reflective mirror 331 from the wafer side is shown in FIG. 7A. The taper 383 is formed so that the light beams 381 and 382 are not blocked by the reflective mirror 331. Furthermore, a smaller taper angle and width result in a larger rigidity of the reflective mirror 331, and are therefore desirable. For example, it is advisable to set the angle of the taper 383 so that this angle is substantially equal to the angle of incidence of the light 381 on the wafer 306. In the present preferred embodiment, the angle of incidence of the light 381 on the wafer 306 is set at 5 degrees, and the taper angle is set at 7 degrees. The taper 383 may be formed around the entire periphery of the reflective mirror as shown in FIG. 7A, or may be formed only in the portion through which the light passes. In cases where a taper is formed only in the portion through which the light passes, it is desirable to select the direction of incidence of the light in an appropriate manner and to locate the taper so that the portion of the back surface of the reflective mirror 331 that directly reflects X-rays is not affected.

Figure 8A:
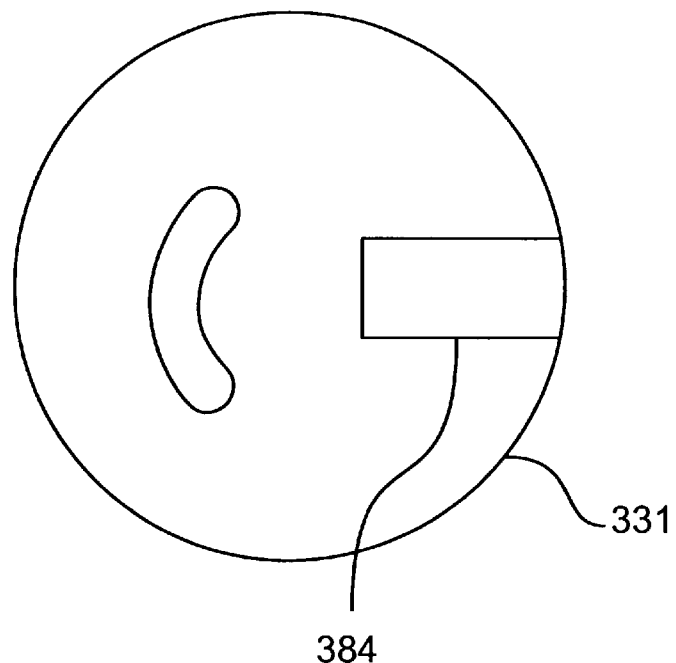
FIGS. 8A and 8B schematically illustrate another configuration of the third preferred embodiment adjacent the reflective mirror 31.
Figure 8B:
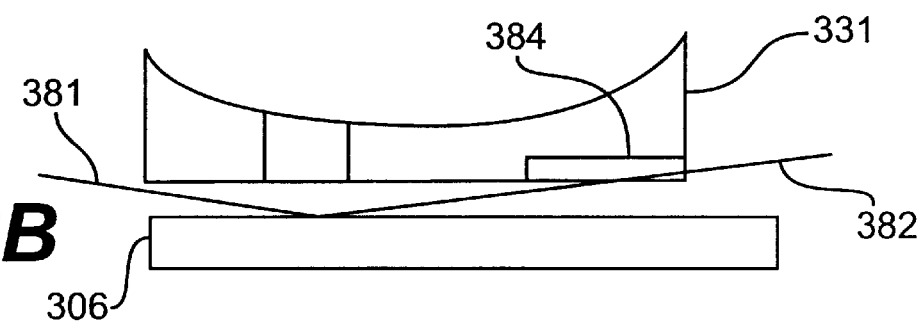

In FIGS. 7A and 7B, taper 383 is formed on the back surface of the reflective mirror 331. However, it is also possible to form a groove. In this way, it is possible to install the focal point detection device 308 so that there is no interference between the light beams 381 and 382 and the reflective mirror 331. An enlarged schematic diagram in the vicinity of the reflective mirror 331 and wafer 306 is shown in FIG. 8B, and a plan view of the reflective mirror 331 from the wafer side is shown in FIG. 8A. A groove 384 is formed so that the light beams 381 and 382 are not blocked by the reflective mirror 331. In FIG. 8B, the groove 384 is formed so that there is no interference with the light beam 382. However, it is also possible to form a groove on the side of the light beam 381. Furthermore, a smaller depth and length of the groove 384 result in a larger rigidity of the reflective mirror 331, and are therefore desirable.

Furthermore, in cases where the depth of the groove is large as a result of the reflective mirror 331 and wafer 306 being installed extremely close to each other, or as a result of the angle of incidence of the light used for focal point detection being large, etc., a through-hole may be formed instead of a grove. When a through-hole is formed, the amount of grinding of the reflective mirror can be reduced; accordingly, the focal point detection device 308 can be installed without lowering the rigidity of the reflective mirror. If the cross-sectional shape of the through-hole is made substantially the same as the cross-sectional shape of the light beam, the cross-sectional area and the volume of the hole can be reduced; accordingly, such an arrangement is desirable. For example, in a case where the cross-sectional shape of the light beam is elliptical, it is desirable that the cross-sectional shape of the hole be formed as an ellipse or as a rectangle, which substantially inscribed the elliptical cross section of the light beam. Furthermore, in cases where the light beam is a focused light beam, it is desirable that a taper be formed in a hole or groove as well (such a taper is formed in the forward direction of the light beam). Moreover, in regard to the location where such a groove or through-hole is to be formed, a drop in the performance of the mirror can be prevented if the direction of incidence of the light beam is appropriately selected, and if the location where the groove or through-hole is formed is set so that the portion of the front surface of the reflective mirror 331 that directly reflects X-rays is not affected. In the present preferred embodiment, the light beams used for focal point detection are illustrated as they lie within the plane of the figures for convenience of illustration However, it is also possible to direct the detection light in a direction perpendicular to the plane of the page, for example. In such a case, the groove or hole is located at an appropriate area.

Figure 9:
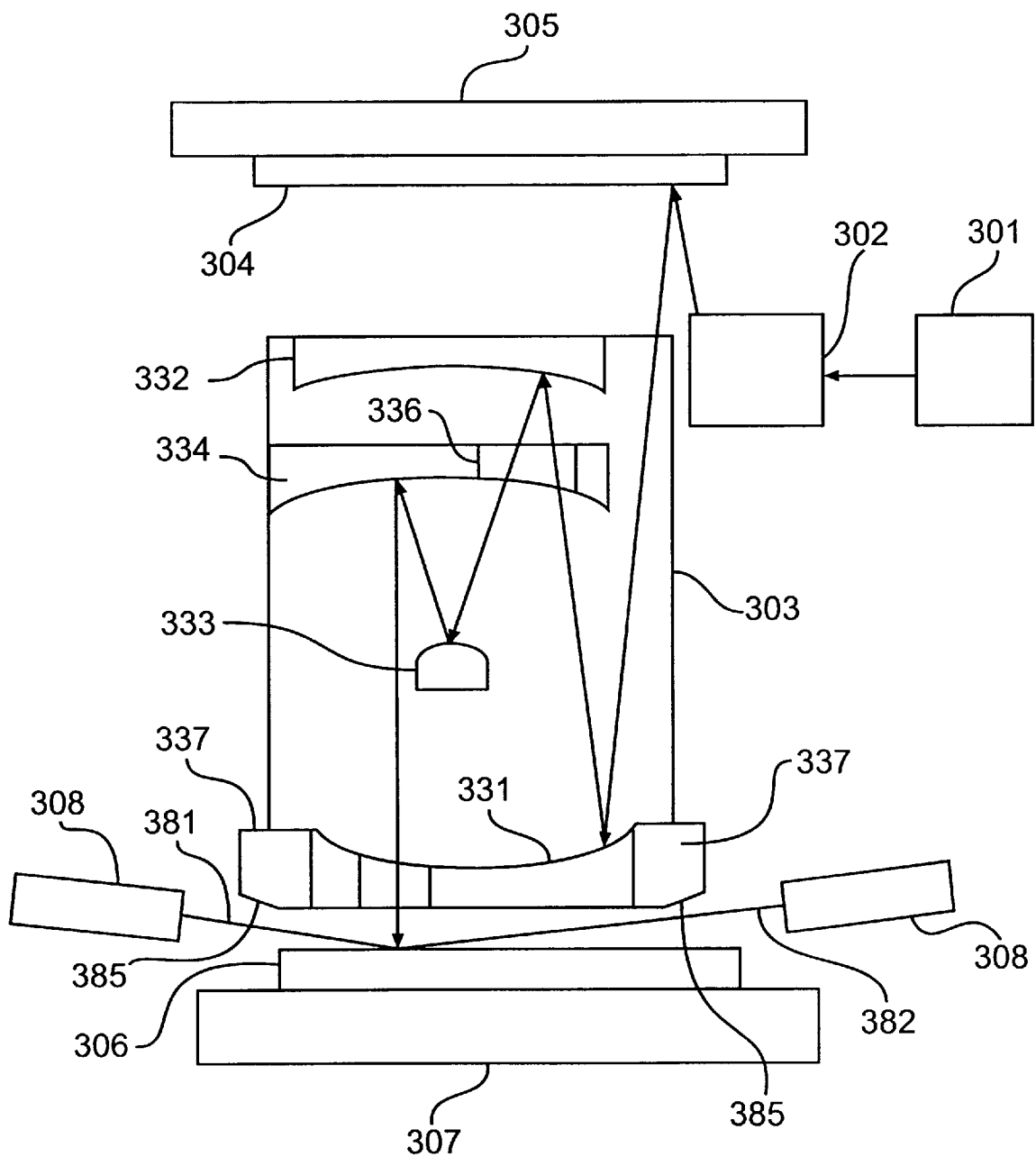
FIG. 9 is a schematic diagram which illustrates an X-ray projection exposure apparatus according to a modified third preferred embodiment of the present invention.

A schematic diagram of an X-ray projection exposure apparatus constructed according to a modified third preferred embodiment of the present invention is shown in FIG. 9.

The apparatus used in the present preferred embodiment is similar to the apparatus shown in FIG. 6. Accordingly, like elements are labeled with the same symbols, and detailed descriptions of such like components are omitted. The apparatus shown in FIG. 9 differs from the apparatus shown in FIG. 6 in that the reflective mirror 331 is held by a holder 337. (The other reflective mirrors may also be held by holders; however, this is not illustrated in the figures.) In cases where the projection focusing optical system is constructed using a plurality of reflective mirrors, it is desirable that the reflective mirrors be held by holders. It is desirable that the holders have a sufficient rigidity to allow the holders to hold the reflective mirrors. For example, the projection focusing optical system can be constructed using a metal frame, with the reflective mirrors fastened to the holders by an adhesive agent, etc., and the holders being mechanically fastened to the metal frame.

In the X-ray projection exposure apparatus of the present preferred embodiment, a space which allows the passage of the light from the position detection mechanism 308 is formed in the holder 337 of the reflective mirror 331 so that there is no interference with the light from the focal point detection device. In FIG. 9, a tapered portion (taper) 385 is formed. As a result, the focal point detection device 308 can be installed without any interference between the light beams 381 and 382 and the holder 337.

Figure 10A:
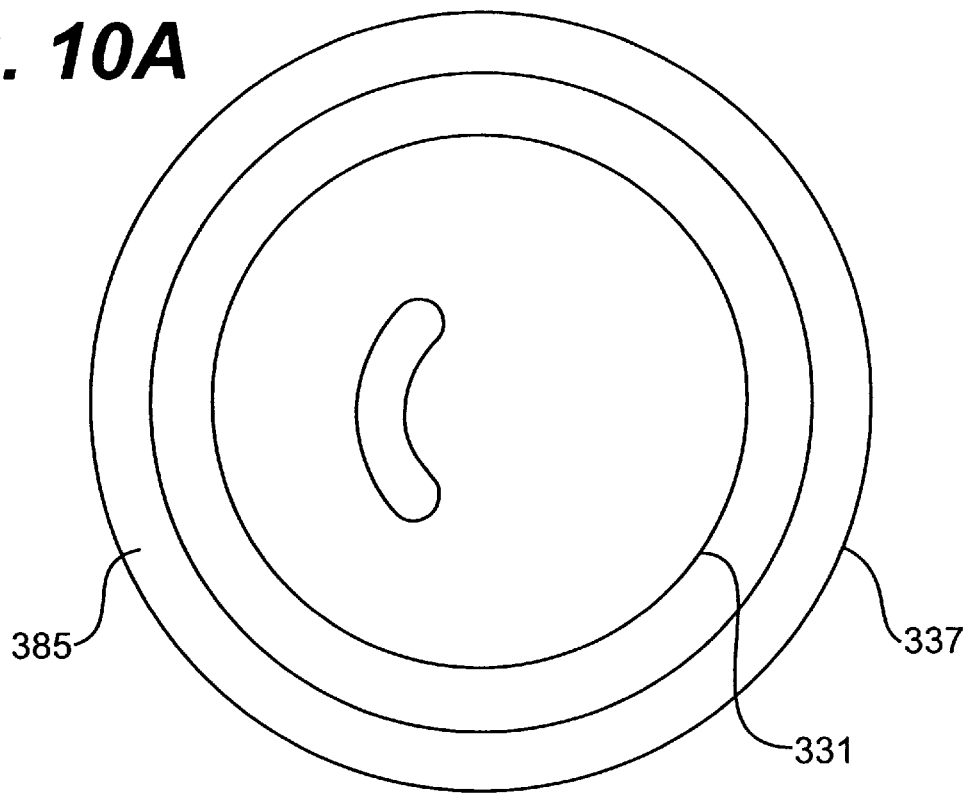
FIGS. 10A and 10B schematically illustrate a configuration of the modified third preferred embodiment adjacent the reflective mirror 37.
Figure 10B:
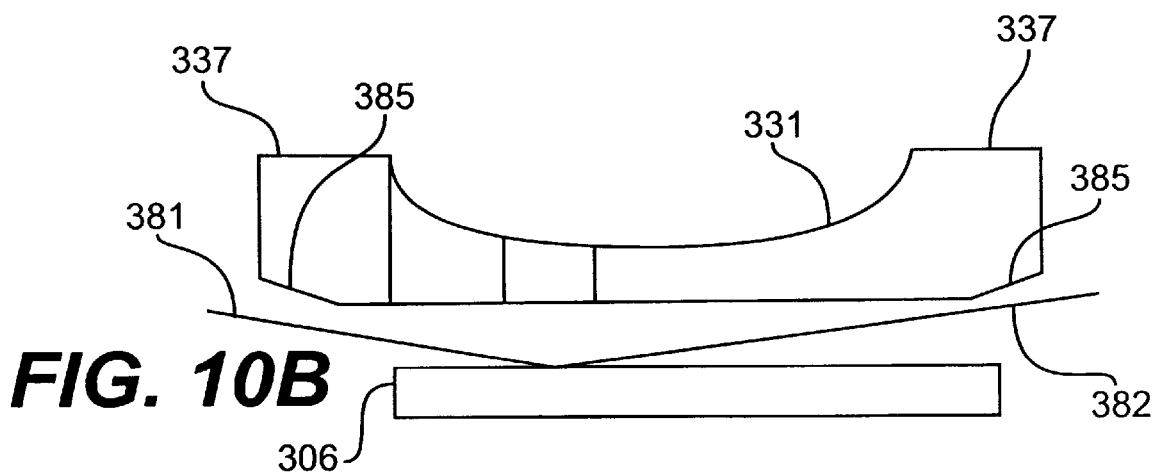

An enlarged schematic diagram in the vicinity of the reflective mirror 331, holder 337, and wafer 306 is shown in FIG. 10B, and a plan view of the reflective mirror 331 and holder 337 from the wafer side is shown in FIG. 10A. A taper 385 is formed so that the light beams 381 and 382 are not blocked by the holder 337. Furthermore, a smaller taper angle and width result in a larger rigidity of the holder 337, and are therefore desirable. For example, it is advisable that the angle of the taper 385 be set roughly equal to the angle of incidence of the light 381 on the wafer. As in the above-mentioned preferred embodiment, the taper 385 may be formed around the entire periphery of the holder as shown in FIG. 10A, or may be formed only in the portion through which the light passes.

Figure 11A:
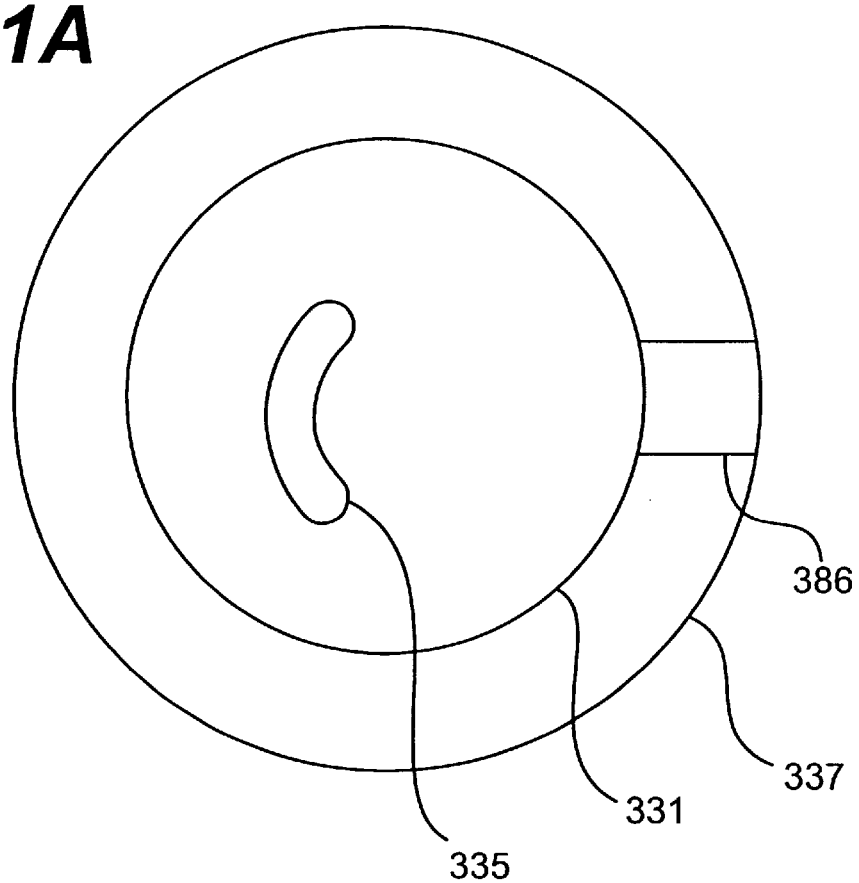
FIGS. 11A and 11B schematically illustrate another configuration of the modified third preferred embodiment adjacent the reflective mirror 37.
Figure 11B:
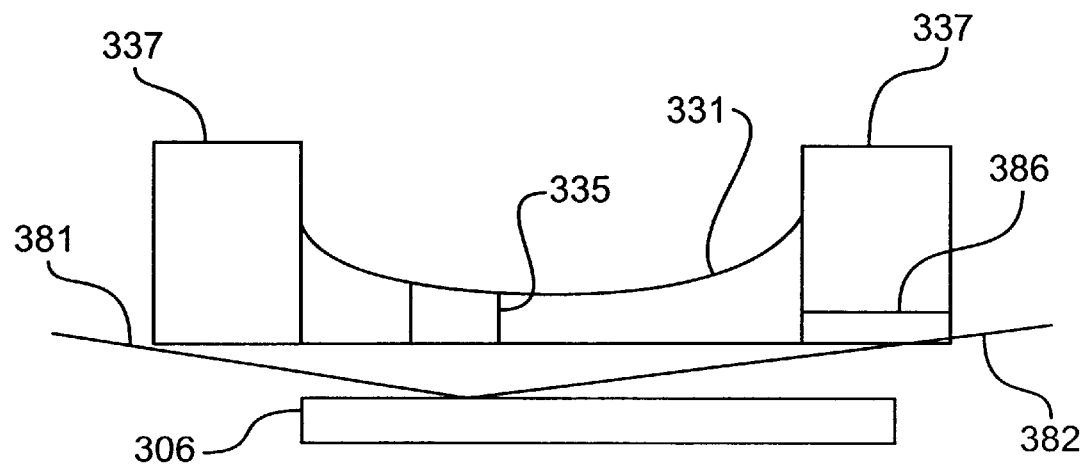
Figure 12:
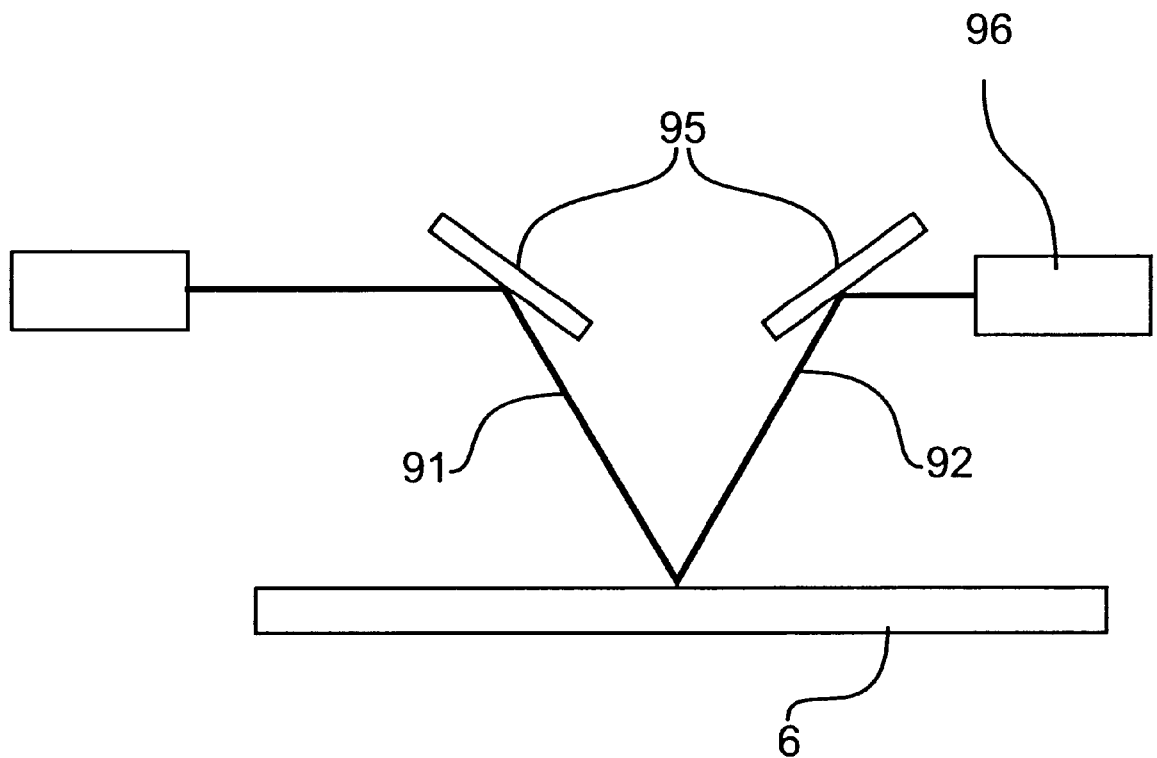
FIG. 12 is a schematic diagram which illustrates a focal point detection device.
Figure 13:
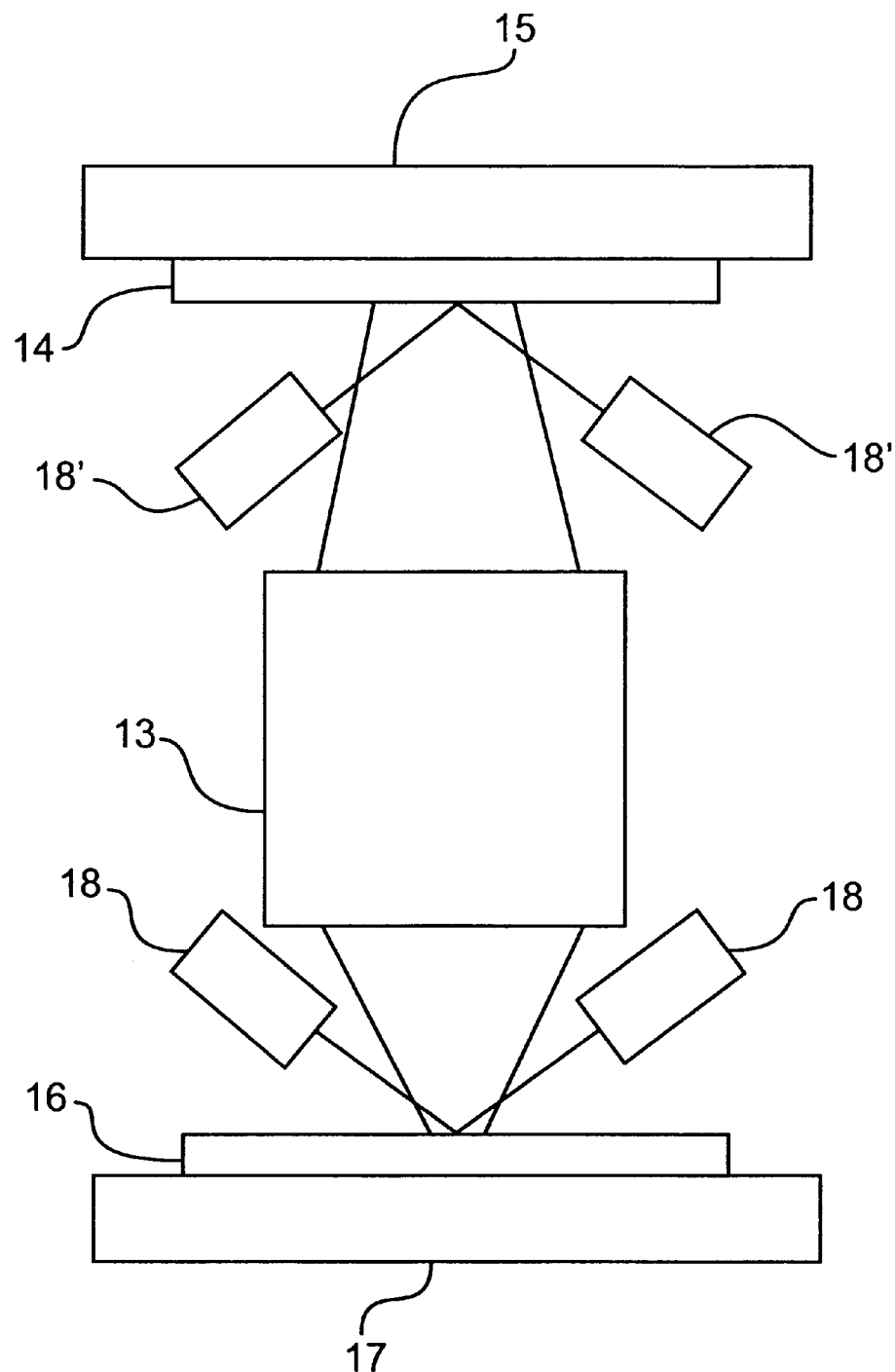
FIG. 13 is a schematic diagram of a conventional i line projection exposure apparatus.
Figure 14:
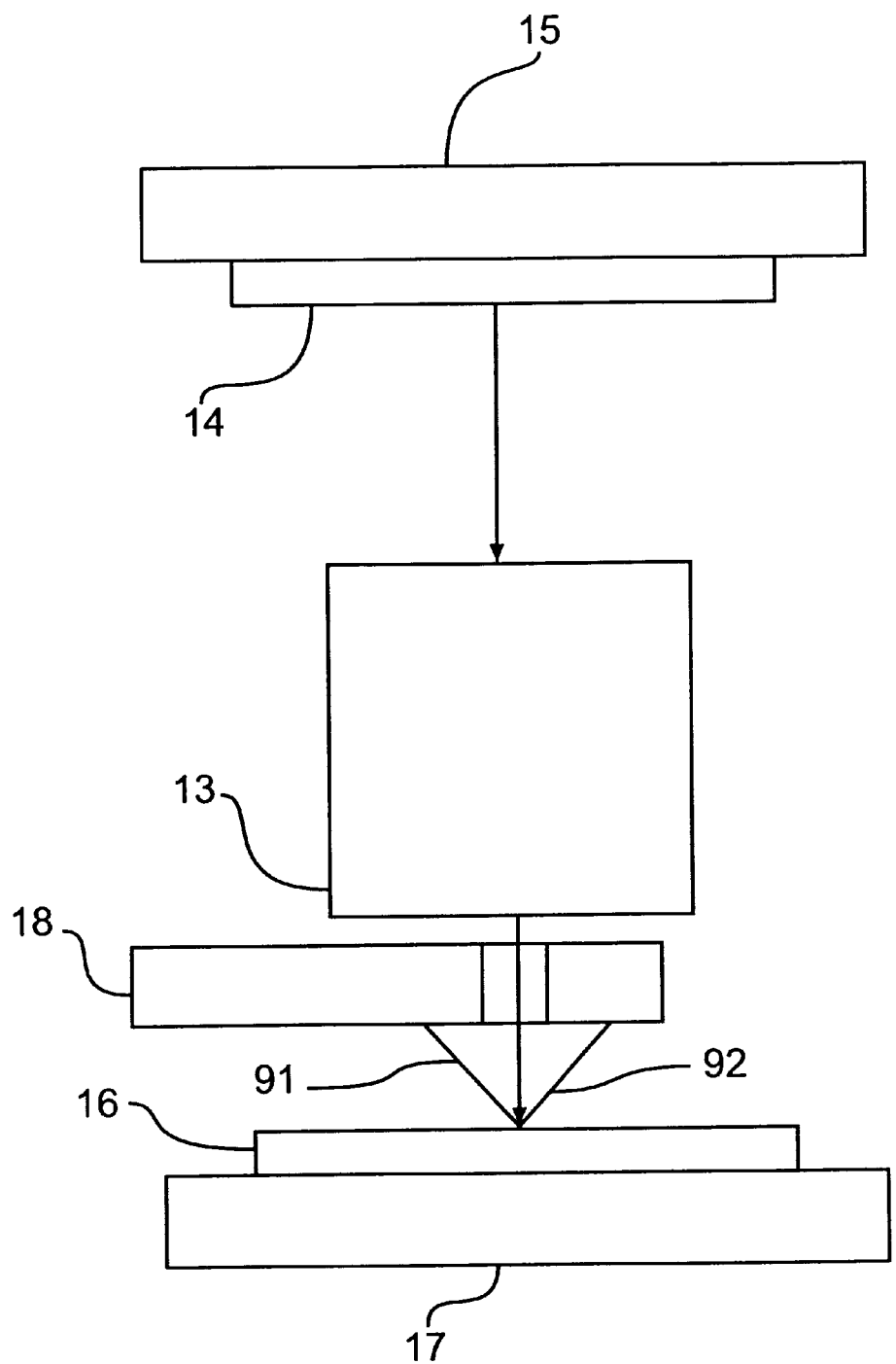
FIG. 14 is a schematic diagram of another conventional projection exposure apparatus using the i line.

As in the above-mentioned preferred embodiment, the tapered part of the holder 337 may also be a groove. In this way, the focal point detection device 308 can be installed without any interference between the light beams 381 and 382 and the holder 337. An enlarged schematic diagram of the area in the vicinity of the reflective mirror 331, holder 337, and wafer 306 is shown in FIG. 11B, and a plan view of the reflective mirror 331 and holder 337 from the wafer side is shown in FIG. 11A. A groove 386 is formed so that the light beams 381 and 382 are not blocked by the holder 337. Furthermore, a smaller depth and length of the groove 386 result in a larger rigidity of the holder 337, and are therefore desirable. In cases where the depth of the groove is large, it is also possible to form a through-hole instead of a groove. This way, it is possible to install the focal point detection device 308 without lowering the rigidity of the holder.

In the apparatuses shown in FIGS. 9 to 11B, cases in which a space such as a taper, etc., was formed only in the holder were illustrated. However, if a different arrangement, which requires that the reflective mirror closest to the wafer and the light from the focal point detection device interfere with each other, is desired, it is preferable to form a space such as a taper, etc., in the reflective mirror as well as in the holder.

Furthermore, it is also possible to install a plurality of focal point detection devices to detect a plurality of points on the wafer. In such a case, it is desirable to form spaces in the reflective mirror and holder so that there is no interference with any of the light beam from the focal point detection devices.

Furthermore, it is desirable to install a temperature adjustment mechanism having cooling water, a cooling medium or a Peltier element, etc., in the focal point detection device. By installing such a temperature adjustment mechanism, it is possible to suppress the generation of heat from the focal point detection device, thus preventing adverse effects on the projection focusing optical system 303.

When exposure is performed using the above-mentioned apparatuses, detection of the focal point of the wafer can be accomplished with a high degree of precision. As a result, resist patterns with a minimum size of 0.1 µm can be obtained with a desired shape throughout a region corresponding to one or more semiconductor chips on the wafer. On the other hand, in the case of the conventional designs of X-ray projection exposure apparatus described in the background section above, resist patterns with a desired fine pattern shape cannot be obtained in the exposed region.

By using the X-ray projection exposure apparatus of the present invention, as described above, it is possible to install a focal point detection device while maintaining the desired small aberration of the projection focusing optical system. As a result, the surface position of the wafer can be adjusted to within the range of the depth of focus of the projection focusing optical system, and resist patterns with a desired shape can be formed in desired regions.

It will be apparent to those skilled in the art that various modifications and variations can be made in the X-ray projection exposure apparatus of the present invention without departing from the spirit or scope of the invention. Thus, it is intended that the present invention cover the modifications and variations of this invention provided they come within the scope of the appended claims and their equivalents.

What is claimed is:

1. An X-ray projection exposure apparatus, comprising:
   an X-ray source that generates X-rays;

a mask stage configured to hold a mask having a mask pattern;

an X-ray illumination optical system that directs the X-rays generated by the X-ray source towards the mask to project the mask pattern;

a substrate stage configured to hold a substrate;

an X-ray projection focusing optical system that receives the X-rays that have interacted with the mask and projects and focuses an image of the mask pattern onto the substrate, the X-ray projection focusing optical system including a plurality of reflective mirrors that reflect the X-rays; and a position detection optical system that optically detects a mark on the mask and a mark on the substrate, at least a portion of the position detection optical system being disposed between the plurality of reflective mirrors.

2. The X-ray projection exposure apparatus according to claim 1, wherein a portion of the position detection optical system is disposed between a reflective mirror closet to the substrate and a reflective mirror second closest to the substrate among the plurality of reflective mirrors in the X-ray projection focusing optical system.

3. The X-ray projection exposure apparatus according to claim 1, wherein the position detection optical system includes an illumination optical system and a detection optical system, the illumination optical system illuminating the mark on the mask with light, the light reflected from the mark on the mask being guided towards the mark on the substrate via at least one of the reflective mirrors in the X-ray projection focusing optical system, the detection optical system detecting the light from the mark on the substrate.

4. The X-ray projection exposure apparatus according to claim 1, wherein the position detection optical system includes an illumination optical system and a detection optical system, the illumination optical system illuminating the mark on the substrate with light, the light reflected from the mark on the substrate being guided towards the mark on the mask via at least one of the reflective mirrors in the X-ray projection focusing optical system, the detection optical system detecting the light from the mark on the mask.

5. The X-ray projection exposure apparatus according to claim 1, wherein the position detection optical system includes a motion mechanism.

6. The X-ray projection exposure apparatus according to claim 1, wherein the numerical aperture of the position detection optical system is equal to or less than one half of the numerical aperture of the X-ray projection focusing optical system.

7. The X-ray projection exposure apparatus according to claim 1, wherein the portion of the position detection optical system that is disposed between the plurality of reflective mirrors includes a half-mirror.

8. The X-ray projection exposure apparatus according to claim 1, wherein the position detection optical system includes a temperature adjustment mechanism.

9. An X-ray projection apparatus, comprising:

an X-ray source that generates X-rays;

an illumination optical system that directs the X-rays generated by the X-ray source towards a mask having a mask pattern;

a substrate stage configured to hold a substrate;

a projection focusing optical system that receives the X-rays that have interacted with the mask and projects and focuses an image of the mask pattern onto the substrate, the projection focusing optical system including a plurality of reflective mirrors that reflect the X-rays; and a position detection device that optically detects a position of the substrate in a direction substantially parallel to an optical axis of the projection focusing optical system, at least a portion of the position detection device being disposed between the plurality of reflective mirrors.

10. The X-ray projection exposure apparatus according to claim 9, wherein at least a portion of the position detection device is disposed between a reflective mirror closest to the substrate and a reflective mirror second closest to the substrate among the plurality of reflective mirrors.

11. The X-ray projection exposure apparatus according to claim 9, wherein a through-hole is formed in a reflective mirror closest to the substrate to provide a passage for light by which the position detection device detects the position of the substrate.

12. The X-ray projection exposure apparatus according to claim 9, wherein the position detection device includes a motion mechanism.

13. The X-ray projection exposure apparatus according to claim 9, wherein the position detection device includes a temperature adjustment mechanism.

14. An X-ray projection exposure apparatus comprising:

An X-ray source that generates X-rays;

an illumination optical system that directs the X-rays generated by the X-ray source towards a mask having a mask pattern;

a substrate stage configured to hold a substrate;

a projection focusing optical system that receives the X-rays that have interacted with the mask and projects and focuses an image of the mask pattern on the substrate, the projection focusing optical system including a plurality of reflective mirrors that reflect the X-rays; and a position detection mechanism that optically detects a position of the substrate in a direction substantially parallel to an optical axis of the projection focusing optical system, wherein a reflective mirror that is closest to the substrate among the plurality of reflective mirrors has a space which allows the passage of light by which the position detection mechanism detects the position of the substrate.

15. The X-ray projection exposure apparatus according to claim 14, wherein the space which allows the passage of the light of the position detection mechanism includes a tapered part formed in the reflective mirror that is closest to the substrate.

16. The X-ray projection exposure apparatus according to claim 14, wherein the space which allows the passage of the light of the position detection mechanism includes at least one of a groove and a through-hole formed in the reflective mirror that is closest to the substrate.

17. An X-ray projection exposure apparatus, comprising:

an X-ray source that generates X-rays;

an illumination optical system that directs the X-rays generated by the X-ray source towards a mask having a mask pattern;

a substrate stage configured to hold a substrate;

a projection focusing optical system that receives the X-rays that have interacted with the mask and projects and focuses an image of the mask pattern onto the substrate, the projection focusing optical system including a plurality of reflective mirrors that reflect the X-rays, the projection focusing optical system further including a holder that holds a reflective mirror that is closest to the substrate; and a position detection mechanism that optically detects a position of the substrate in a direction substantially parallel to an optical axis of the projection focusing optical system, wherein the holder has a space in its surface facing the substrate, the space allowing the passage of light by which the position detection mechanism detects the position of the substrate.

18. The X-ray projection exposure apparatus according to claim 17, wherein the space, which allows the passage of the light of the position detection mechanism, includes a tapered part formed in the holder.

19. The X-ray projection exposure apparatus according to claim 17, wherein the space, which allows the passage of the light of the position detection mechanism, includes at least one of a groove and a through-hole formed in the holder.

20. An X-ray projection exposure apparatus, comprising:
an X-ray source that generates X-rays;
a mask stage configured to hold a mask having a mask pattern;
an X-ray illumination optical system that directs the X-rays generated by the X-ray source towards the mask;
a substrate stage configured to hold a substrate;
an X-ray projection focusing optical system that receives the X-rays that have interacted with the mask and projects and focuses an image of the mask pattern onto the substrate, the X-ray projection focusing optical system including a plurality of reflective mirrors that reflect X-rays, a reflective mirror closest to the substrate stage being adjacent the substrate stage; and
a position detection optical system that optically detects a position of the substrate,
wherein the X-ray projection focusing optical system is configured to accommodate at least a portion of the position detection optical system disposed between the plurality of reflective mirrors.

21. The X-ray projection exposure apparatus according to claim 20, wherein the position detection optical system detects the position of the substrate in a direction substantially parallel to an optical axis of the X-ray projection focusing optical system.

22. The X-ray projection exposure apparatus according to claim 20, wherein the position detection optical system detects the position of the substrate relative to a position of the mask.

23. The X-ray projection exposure apparatus according to claim 20, wherein the position detection optical system detects the position of the substrate in a direction substantially perpendicular to an optical axis of the X-ray projection focusing optical system.

24. The X-ray projection exposure apparatus according to claim 20, wherein the portion of the position detection optical system includes a retractable optical element to be inserted between two of the plurality of reflective mirrors upon detecting the position of the substrate.

25. The X-ray projection exposure apparatus according to claim 24, wherein when inserted, the retractable optical element is positioned between the reflective mirror closest to the substrate stage and the reflective mirror second closest to the substrate stage.

26. The X-ray projection exposure apparatus according to claim 24, wherein when the retractable optical element is inserted, the position detection optical system utilizes at least one of the reflective mirrors in the X-ray projection focusing optical system to detect the position of the substrate.

27. The X-ray projection exposure apparatus according to claim 20, wherein the portion of the position detection optical system to be accommodated by the X-ray projection focusing optical system includes an optical path for a detection light by which the position detection optical system detects the position of the substrate, and
wherein the reflective mirror closest to the substrate stage is configured to provide a passage for the optical path of the detection light.

28. The X-ray projection exposure apparatus according to claim 27, wherein the reflective mirror closest to the substrate stage has a tapered portion providing the passage for the optical path of the detection light.

29. The X-ray projection exposure apparatus according to claim 27, wherein the reflective mirror closest to the substrate stage has a through-hole providing the passage for the optical path of the detection light.

* * * * *